United States Patent
Cui et al.

(10) Patent No.: US 10,964,751 B2
(45) Date of Patent: Mar. 30, 2021

(54) SEMICONDUCTOR DEVICE HAVING PLURAL DUMMY MEMORY CELLS

(71) Applicant: SAMSUNG ELECTRONICS CO., LTD., Suwon-si (KR)

(72) Inventors: Hao Cui, Suwon-si (KR); Se Yun Park, Seoul (KR); Jong Hyuk Park, Hwaseong-si (KR); Bo Un Yoon, Seoul (KR); Il Young Yoon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 4 days.

(21) Appl. No.: 16/586,140

(22) Filed: Sep. 27, 2019

(65) Prior Publication Data

US 2020/0235165 A1  Jul. 23, 2020

(30) Foreign Application Priority Data

Jan. 17, 2019  (KR) .................. 10-2019-0006066

(51) Int. Cl.
 *H01L 27/24* (2006.01)
 *H01L 45/00* (2006.01)

(52) U.S. Cl.
 CPC ...... *H01L 27/2463* (2013.01); *H01L 27/2427* (2013.01); *H01L 45/06* (2013.01); *H01L 45/126* (2013.01); *H01L 45/1233* (2013.01); *H01L 45/141* (2013.01); *H01L 45/144* (2013.01); *H01L 45/1666* (2013.01); *H01L 45/1683* (2013.01)

(58) Field of Classification Search
 CPC . H01L 27/2427; H01L 27/2463; H01L 45/06; H01L 45/065; H01L 45/1226; H01L 45/1246; H01L 45/141; H01L 45/142; H01L 45/143; H01L 45/144; H01L 45/1666; H01L 45/1683
 See application file for complete search history.

(56) References Cited

U.S. PATENT DOCUMENTS 7,767,568 B2 * 8/2010 An .................. H01L 27/2463
                                                      438/588
8,482,100 B2    7/2013 Cho
(Continued)

FOREIGN PATENT DOCUMENTS

KR       10-0772251      10/2007
KR     10-2008-0087418   10/2008
(Continued)

*Primary Examiner* — Stephen W Smoot
(74) *Attorney, Agent, or Firm* — F. Chau & Associates, LLC

(57) ABSTRACT

A semiconductor device that includes a plurality of word lines disposed on a substrate in which p-type and n-type active regions are defined, and extends in a first direction. A plurality of bit lines is disposed on the plurality of word lines and extends in a second direction, perpendicular to the first direction. A plurality of memory cells is disposed between the plurality of word lines and the plurality of bit lines and each includes a data storage pattern. The plurality of memory cells includes a plurality of dummy memory cells and a plurality of main memory cells. An upper surface of the data storage pattern of the main memory cells is higher than an upper surface of the data storage pattern of the dummy memory cells.

20 Claims, 23 Drawing Sheets

(56) References Cited

U.S. PATENT DOCUMENTS

| | | |
|---|---|---|
| 9,343,463 B2 | 5/2016 | Zhong et al. |
| 9,985,075 B2 | 5/2018 | Chuang et al. |
| 2006/0239094 A1* | 10/2006 | Maki .................. H01L 27/1104 365/63 |
| 2010/0190339 A1 | 7/2010 | Chen et al. |
| 2013/0241000 A1* | 9/2013 | Lee ........................ H01L 45/06 257/379 |
| 2013/0292629 A1 | 11/2013 | Liu et al. |
| 2014/0024216 A1 | 1/2014 | Stender et al. |
| 2017/0084710 A1 | 3/2017 | Koh et al. |
| 2018/0151623 A1* | 5/2018 | Terai .................. H01L 45/1666 |
| 2018/0287055 A1* | 10/2018 | Park ....................... H01L 45/06 |
| 2020/0091240 A1* | 3/2020 | Hong .................. H01L 27/2409 |

FOREIGN PATENT DOCUMENTS

| | | |
|---|---|---|
| KR | 10-2009-0001193 | 1/2009 |
| KR | 10-2009-0088008 | 8/2009 |
| KR | 10-2009-0098193 | 9/2009 |
| KR | 10-2011-0011776 | 2/2011 |

* cited by examiner

IV – IV'

SEMICONDUCTOR DEVICE HAVING PLURAL DUMMY MEMORY CELLS

CROSS-REFERENCE TO RELATED APPLICATION(S)

This application claims priority under 35 U.S.C. § 119 to Korean Patent Application No. 10-2019-0006066, filed on Jan. 17, 2019 in the Korean Intellectual Property Office, the disclosure of which is incorporated by reference in its entirety herein.

TECHNICAL FIELD

The present inventive concept relates to a semiconductor device and a method of manufacturing the same.

DISCUSSION OF RELATED ART

Semiconductor devices, such as phase-change random access memory ("PRAM"), resistive random access memory ("RRAM") and the like have been developed to provide high performance and lower power consumption. These next-generation semiconductor devices are fabricated using a data storage material having a resistance that is changed in response to a voltage or current.

A planarization process is used to form data storage patterns from the data storage material. In the planarization process, friction between slurry and the data storage material may result in the formation of recess defects in the data storage patterns.

To prevent the occurrence of recess defects in the data storage patterns, methods of increasing the number of dummy memory cells or developing a novel slurry material have been proposed. However, these methods are problematic with respect to high integration and cost efficiency.

SUMMARY

An aspect of the exemplary embodiments of the present inventive concepts is to provide a semiconductor device in which a recess defect in a data storage pattern may be significantly reduced, and a method of manufacturing the same.

According to an exemplary embodiment of the present inventive concepts, a semiconductor device includes a plurality of word lines disposed on a substrate in which active regions are defined, and extends in a first direction. A plurality of bit lines is disposed on the plurality of word lines and extends in a second direction, perpendicular to the first direction. A plurality of memory cells is disposed between the plurality of word lines and the plurality of bit lines and each includes a data storage pattern. The plurality of memory cells includes a plurality of dummy memory cells and a plurality of main memory cells. An upper surface of the data storage pattern of the main memory cells is higher than an upper surface, of the data storage pattern of the dummy memory cells.

According to an exemplary embodiment of the present inventive concepts, a semiconductor device includes a plurality of row lines disposed on a substrate and extending in a first direction. The row lines are spaced apart from each other in a second direction, perpendicular to the first direction. A plurality of column lines is disposed on the plurality of row lines. The column lines are spaced apart from each other in the first direction while extending in the second direction. A plurality of memory cells is disposed between the plurality of row lines and the plurality of column lines and extends in a third direction, perpendicular to the first and second directions. The plurality of memory cells include a plurality of main memory cells and a plurality of dummy memory cells. At least one of the plurality of dummy memory cells is connected to one of active regions defined in the substrate, or floats from the active regions.

According to an exemplary embodiment of the present inventive concepts, a semiconductor device includes a first row line disposed on a substrate and extending in a first direction. A second row line extends in the first direction and is spaced apart from the first row line in a second direction, perpendicular to the first row line. A column line is disposed on the first and second row lines and extends in the second direction. A first memory cell is disposed between the first row line and the column line. A second memory cell is disposed between the second row line and the column line. Each of the first and second memory cells includes a data storage pattern. A thickness of the data storage pattern of the first memory cell is less than a thickness of the data storage pattern of the second memory cell.

According to an exemplary embodiment of the present inventive concepts, a method for manufacturing a semiconductor device, includes forming a plurality of row lines on a substrate in which at least one active region is defined. The plurality of row lines extends in a first direction. A plurality of column lines is formed on the plurality of row lines. The plurality of column lines extends in a second direction, perpendicular to the first direction. A plurality of memory cells is formed between the plurality of row lines and the plurality of column lines. The memory cells each include a data storage pattern. The plurality of memory cells includes a plurality of dummy memory cells and a plurality of main memory cells. The dummy memory cells are connected to the at least one active region defined in the substrate, or the dummy memory cells float from the at least one active region.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION OF THE EXEMPLARY EMBODIMENTS

Figure 1:
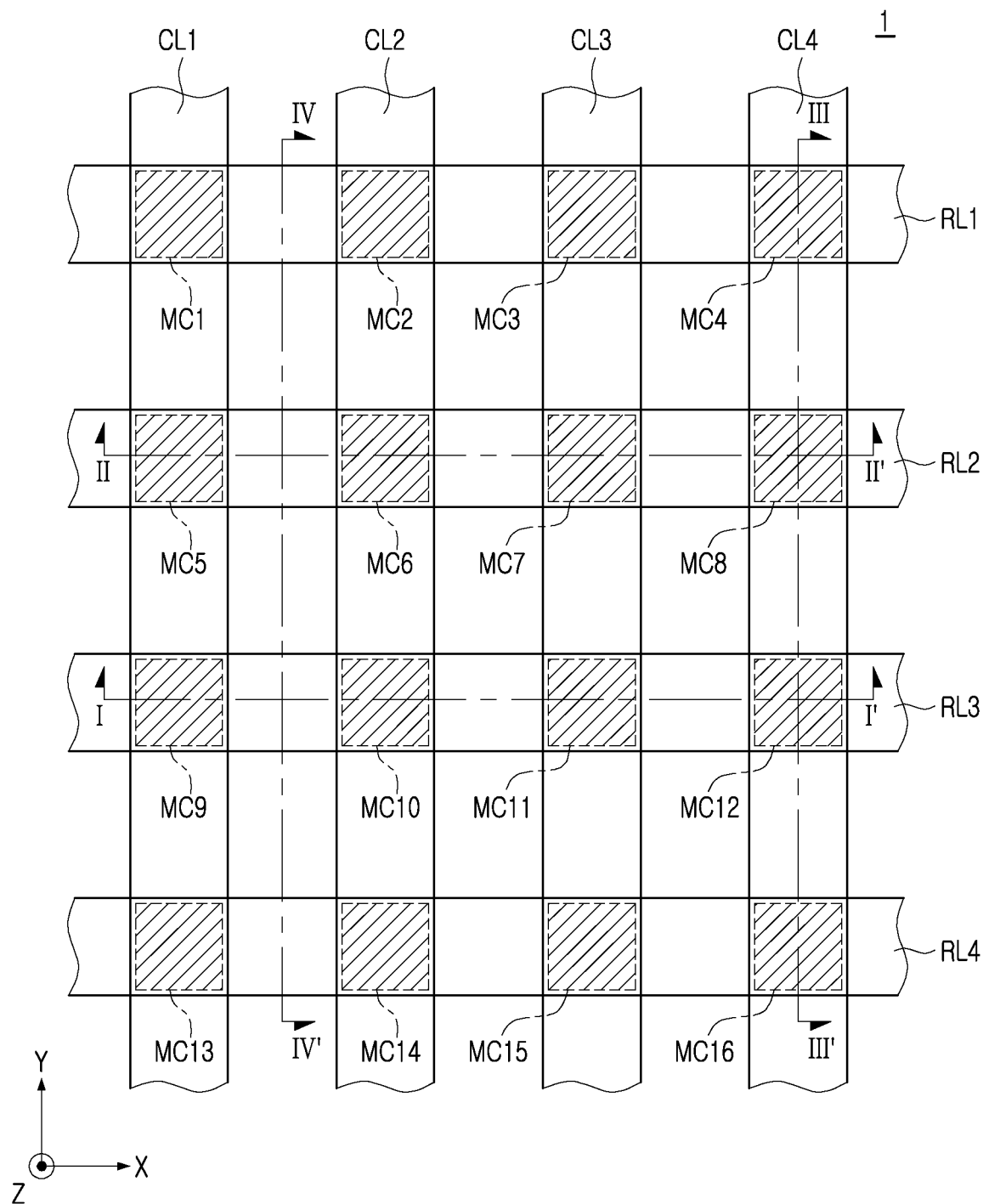
FIG. 1 is a plan view of a semiconductor device according to an exemplary embodiment of the present inventive concepts.

Hereinafter, exemplary embodiments of the present inventive concepts will be described with reference to the accompanying drawings. The same reference numerals are used for the same constituent elements in the drawings, and redundant descriptions of the same constituent elements will be omitted.

FIG. 1 is a plan view of a semiconductor device according to an exemplary embodiment of the present inventive concepts.

Referring to FIG. 1, a semiconductor device 1 may include first to fourth row lines RL1 to RL4, first to fourth column lines CL1 to CL4, and first to sixteenth memory cells MC1 to MC16 arranged between the first to fourth row lines RL1 to RL4 and the first to fourth column lines CL1 to CL4, on a substrate 10. However, the number of row lines, column lines and memory cells are not limited thereto. In an exemplary embodiment, the first to fourth row lines RL1 to RL4 may be word lines, and the first to fourth column lines CL1 to CL4 may be bit lines.

The substrate 10 may have an upper surface extending in a first direction (e.g., an X-axis direction) and in a second direction (e.g., a Y-axis direction) that is perpendicular to the first direction. In an exemplary embodiment, the substrate 10 may include a semiconductor material such as a Group IV semiconductor, a Group III-V compound semiconductor, or a Group II-VI oxide semiconductor. For example, the Group IV semiconductor may include silicon, germanium or silicon-germanium. The substrate 10 may be provided as a bulk wafer or an epitaxial layer.

FIGS. 2, 3, 4 and 5 are cross-sectional views of a semiconductor device according to exemplary embodiments, taken along lines I-I', II-II', III-III' and IV-IV' of FIG. 1, respectively.

Figure 6:
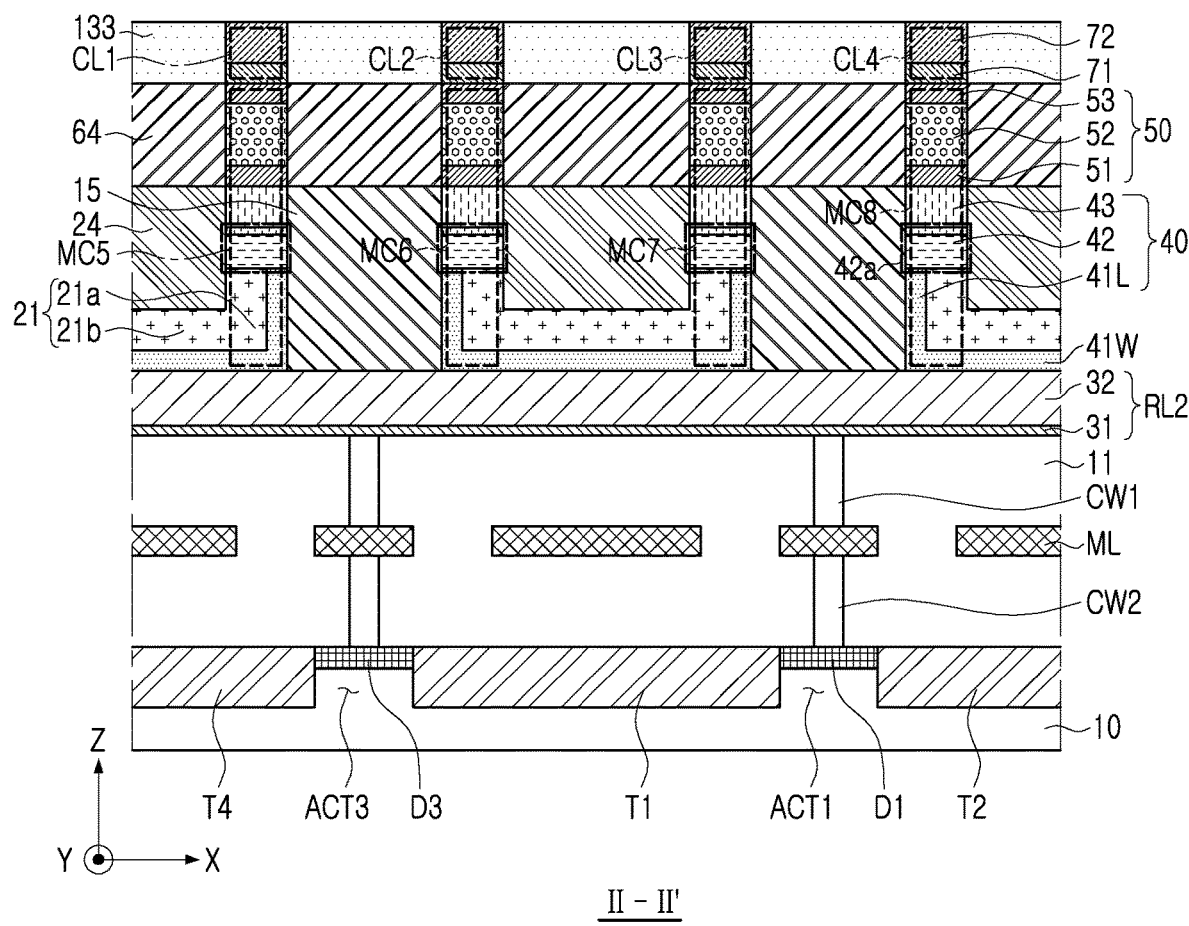
FIGS. 6 and 7 are cross-sectional views of a semiconductor device taken along lines II-II' and IV-IV' of FIG. 1, respectively, according to exemplary embodiments of the present inventive concepts.
Figure 7:
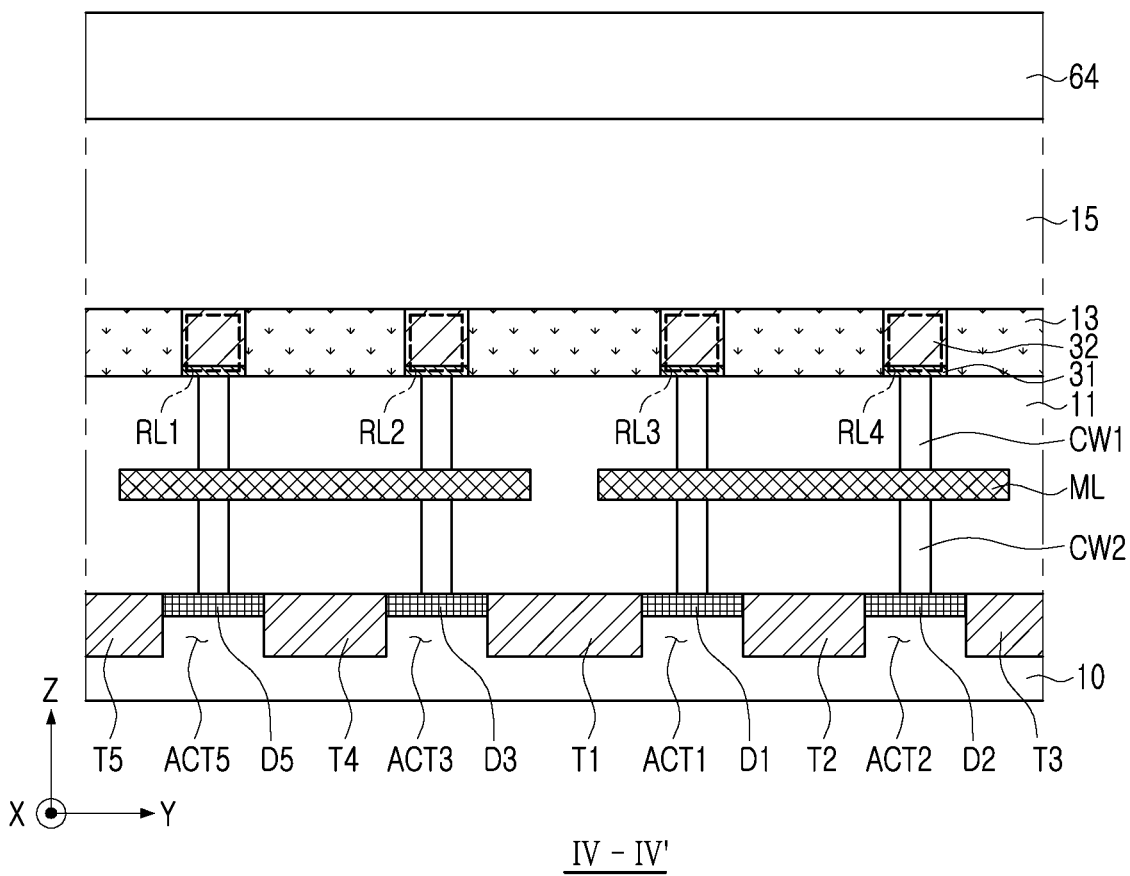

FIGS. 6 and 7 are cross-sectional views of a semiconductor device according to exemplary embodiments, taken along lines II-II' and IV-IV' of FIG. 1, respectively.

Referring to FIGS. 2 to 5, a plurality of isolation films T1 to T6 may be formed on the substrate 10. For example, a plurality of isolation films T1 to T6 may be formed on the substrate. Each of the plurality of isolation films T1 to T6 may include an insulating material such as silicon oxide or the like. A plurality of active regions ACT1 to ACT5 may be isolated and defined by the plurality of isolation films T1 to T6.

A plurality of impurity regions D1 to D5 may respectively be formed in the plurality of active regions ACT1 to ACT5 using an ion implantation process or the like. When the plurality of impurity regions D1 to D5 include p-type impurities such as boron, aluminum, or the like, the plurality of active regions ACT1 to ACT5 including the plurality of impurity regions D1 to D5 may be p-type active regions. Also, when the plurality of impurity regions include n-type impurities such as phosphorus, arsenic or the like, the plurality of active regions ACT1 to ACT5 including the plurality of impurity regions D1 to D5 may be n-type active regions. At least one transistor may be formed in each of the first to fifth active regions ACT1 to ACT5 using the impurity regions D1 to D5. In the exemplary embodiments shown in FIGS. 2 to 5, the first and fifth active regions ACT1 and ACT5 may be the p-type active regions including the p-type impurities, and the second, third, and fourth active regions ACT2, ACT3 and ACT4 may be the n-type active regions including the n-type impurities. Further, a PMOS transistor may be formed in each of the first and fifth active regions ACT1 and ACT5, and a NMOS transistor may be formed in each of the second, third, and fourth active regions ACT2, ACT3 and ACT4.

A base insulating layer 11 may be disposed on the substrate 10. The base insulating layer 11 may be formed of an insulating material such as silicon oxide.

Figure 2:
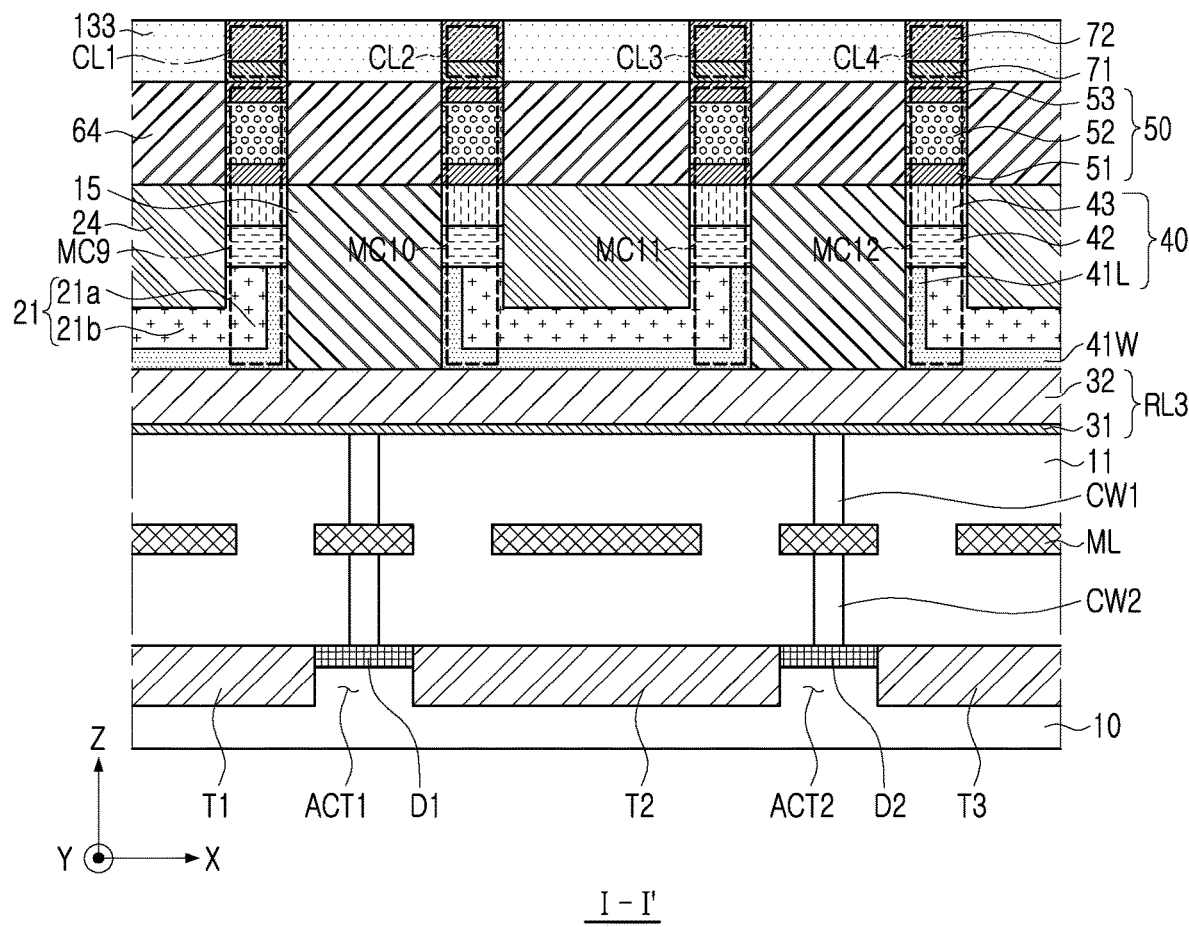
FIGS. 2, 3, 4 and 5 are cross-sectional views of a semiconductor device taken along lines I-I', II-II', III-III' and IV-IV' of FIG. 1, respectively, according to exemplary embodiments of the present inventive concepts.

A plurality of circuit wirings ML may be disposed in the base insulating layer 11. Further, a plurality of contact plugs may be disposed on at least one of the active regions ACT1 to ACT5 for connection to a portion of the circuit wirings ML. For example, as shown in FIG. 2, first and second contact plugs CW1 and CW2 may be disposed respectively between the third row line RL3 and each of the first and second active regions ACT1 and ACT2.

The first to fourth row lines RL1 to RL4 may be formed on the base insulating layer 11, to extend in the first direction (e.g., the X-axis direction) and be spaced apart from each other in the second direction (e.g., the Y-axis direction), perpendicular to the first direction.

The first to fourth row lines RL1 to RL4 may be formed of a conductive material. For example, the first to fourth row lines RL1 to RL4 may be formed of a metal such as tungsten, copper, titanium, or the like.

In an exemplary embodiment, the first to fourth row lines RL1 to RL4 may be divided into a first subtitle and a second subline. For example, first and second row lines RL1 and RL2 may constitute the first subline, and third and fourth row lines RL3 and RL4 may constitute the second subline. In an exemplary embodiment, the first and second row lines RL1 and RL2 may be dummy word lines, in which dummy memory cells MC1 to MC8 not having a data storage function are disposed in an upper portion thereof. The third and fourth row lines RL3 and RL4 may be main word lines, in which main memory cells MC9 to MC16 having a data storage function are disposed in an upper portion thereof.

The dummy memory cells MC1 to MC8 may have the same structure as that of the main memory cells MC9 to MC16. However, the dummy memory cells MC1 to MC8 may not be used as data storage elements unlike the main memory cells MC9 to MC16. During a program operation of a memory device including the semiconductor device according to an exemplary embodiment, a pass voltage which has a voltage level equal to that of a voltage provided to unselected main word lines, may be provided to dummy word lines RL1 and RL2. During a read operation of the memory device, a read voltage, for example, a voltage of 4.5 V, which has a voltage level equal to that of a voltage provided to the unselected main word lines, may be provided to the dummy word lines RL1 and RL2. During an erase operation of the memory device, a 0 V voltage may be provided to the dummy word lines RL1 and RL2, which has a voltage level equal to that of a voltage provided to other word lines.

Figure 4:
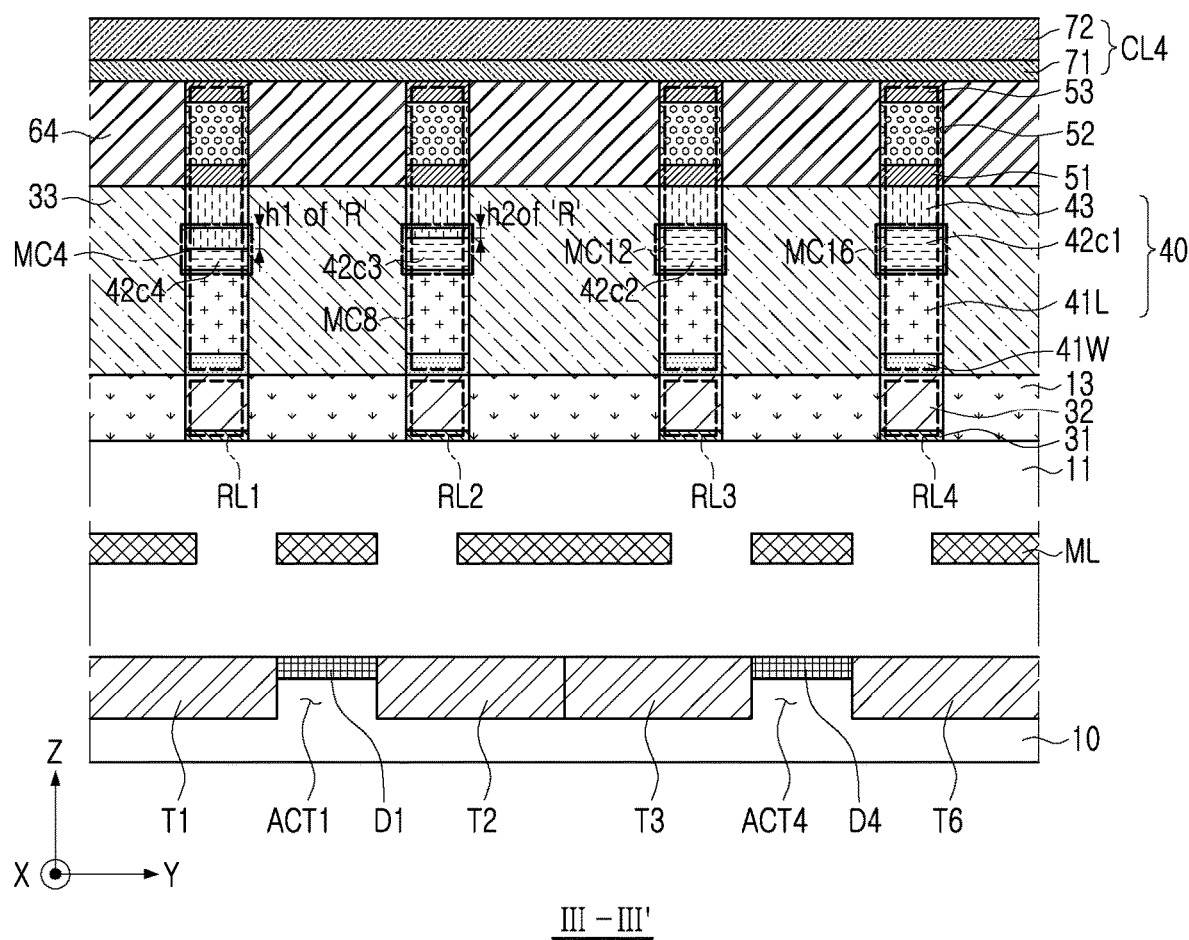
Figure 5:
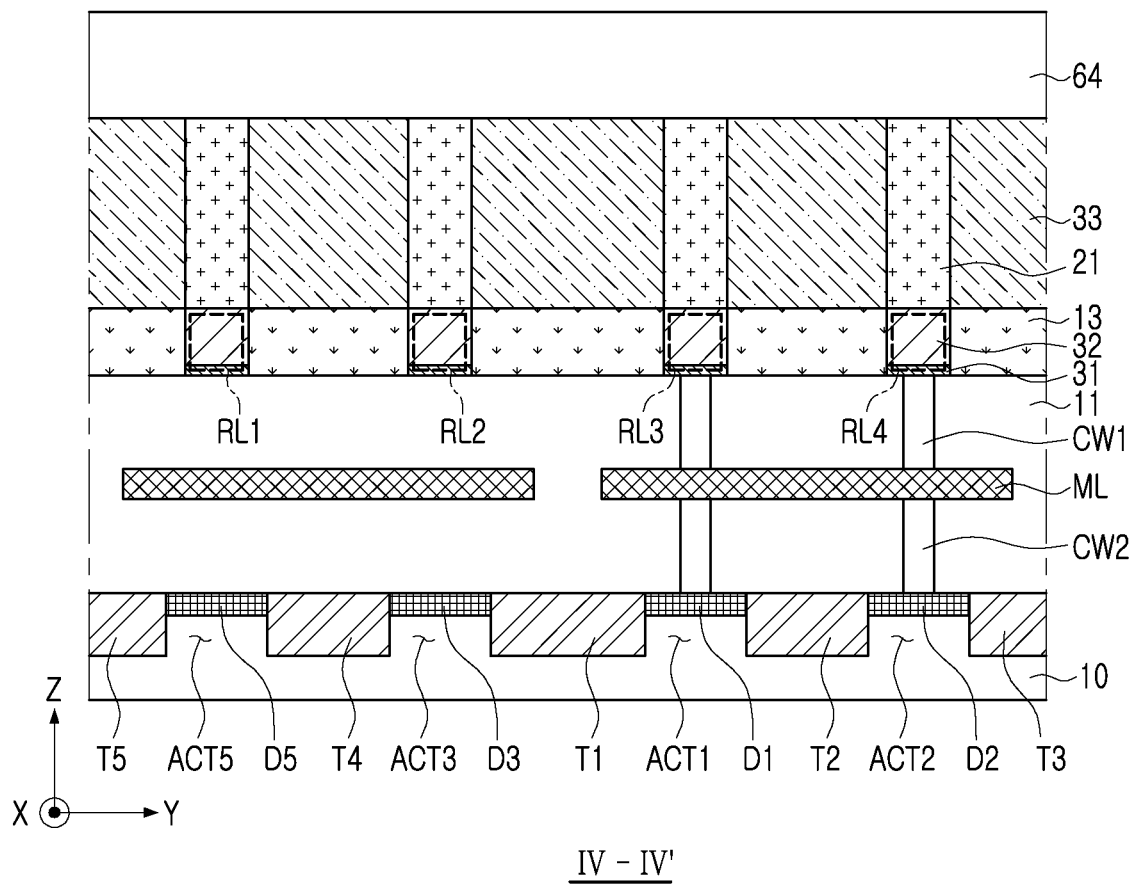

As shown in FIGS. 4-5, first gap fill patterns 13 may be disposed between the first to fourth row lines RL1 to R14. The first gap fill patterns 13 may extend in the first direction (e.g., the X direction). The first gap fill patterns 13 may be formed of an insulating material such as silicon nitride.

Each of the first to fourth row lines RL1 to RL4 may include a first lower conductive layer 31 and a second lower conductive layer 32, sequentially stacked. In an exemplary embodiment, the first lower conductive layer 31 may be formed of a barrier layer such as titanium (Ti) and titanium nitride (TiN), and the second lower conductive layer 32 may be formed of a material having a low specific resistance, such as tungsten (W).

As shown in FIG. 2, the third row line RL3, as the main word line, may have a lower structure connected to both the first and second active regions ACT1 and ACT2. For example, two first contact plugs CW1 may be disposed above different portions of the circuit wirings ML in the base insulating layer 11 to connect the portions of the circuit wirings ML to a first lower conductive layer 31. Also, two second contact plug CW2 may be disposed below the portions of the circuit wirings ML to connect the portions of the circuit wirings ML to the first and second active regions ACT1 and ACT2. One of the second contact plugs CW2 may connect a portion of the circuit wirings ML to the first active region ACT1, and the other may connect a portion of the circuit wirings ML to the second active region ACT2. The first and second contact plugs CW1 and CW2 and the circuit wirings ML, which are interconnected, may constitute a contact structure. The fourth row line RL4, as the main word line, may have a same lower structure as that of the third row line RL3.

Although the exemplary embodiments provide the structure in which the first and second contact plugs CW1 and CW2 are disposed above and below the circuit wirings ML by way of example, exemplary embodiments of the present inventive concept are not limited thereto. For example, the semiconductor device 1 according to an exemplary embodiment may have a structure in which a plurality of contact plugs and a plurality of circuit wirings may be alternately and repeatedly disposed.

First insulating patterns 15 may be disposed on each of the first to fourth row lines RL1 to RL4, and between the memory cells MC1 to MC16.

As shown in FIGS. 4-5, second insulating patterns 33 may be disposed on the first gap fill patterns 13. The second insulating patterns 33 may extend in the first direction (e.g., the x direction). The first insulating patterns 15 and the second insulating patterns 33 may be formed of an insulating material, such as silicon nitride.

Data storage structures 40 may be disposed on each of the first to fourth row lines RL1 to RL4, and between the first insulating patterns 15.

Each of the data storage structures 40 may include a lower electrode 41L, a data storage pattern 42, and an upper electrode 43, that are sequentially stacked. As shown in FIG. 4, the data storage structures 40 may be disposed between the second insulating patterns 33. For example, a data storage pattern 42c1 may be included in a data storage structure disposed on the fourth row line RL4, a data storage pattern 42c2 may be included in a data storage structure disposed on the third row line RL3, a data storage pattern 42c3 may be included in a data storage structure disposed on the second row line RL2, and a data storage pattern 42c4 may be included in a data storage structure disposed on the first row line RL1.

The lower electrode 41L may be disposed between the data storage pattern 42 and the first to fourth row lines RL1 to RL4, and may contact the data storage pattern 42. In exemplary embodiments, the lower electrode 41L, may contact the first insulating pattern 15. The lower electrode 41L may have a linear or bar shape, parallel to an upper surface of the substrate 10 and extending in a second direction, perpendicular to the first direction. The upper electrode 43 may be disposed above the data storage pattern 42, and may contact the data storage pattern 42. A pair of data storage patterns 42 facing each other may be disposed between a pair of first insulating patterns 15 adjacent to each other.

A lower electrode connection portion 41W may extend from the lower portion of the lower electrode 41L in a direction parallel to the upper surface of the substrate 10 (e.g., the X direction). Between the pair of adjacent first insulating patterns 15 on each of the first to fourth row lines RL1 to RL4, the lower electrode connection portion 41W may be disposed to extend from a lower portion of the lower electrodes 41L in contact with the pair of data storage patterns 42. The lower electrode connection portion 41W may respectively contact the first to fourth row lines RL1 to RL4. The lower electrode connection portion 41W may be formed integrally with the lower electrodes 41L between the pair of first insulating patterns 15 adjacent to each other on the first to fourth row lines RL1 to RL4.

Spacers 21a may be disposed between the second insulating patterns 33. The spacers 21a may be respectively disposed between the data storage pattern 42 and the first to fourth row lines RL1 to RL4 together with the lower electrode 41L.

A spacer connection portion 21b may be disposed on the lower electrode connection portion 41W and between a pair of first insulating patterns 15 adjacent to each other on each of the first to fourth row lines RL1 to RL4. The pair of spacers 21a adjacent to each other may extend upwardly from both ends of the spacer connection portion 21b and may contact the data storage patterns 42. The pair of spacers 21a adjacent to each other may be formed integrally with the spacer connection portion 21b.

The lower electrodes 41L may be disposed between the spacers 21a and the first insulating patterns 15, and the lower electrode connection portion 41W may be disposed between the spacer connection portions 21b and the first to fourth row lines RL1 to RL4.

Between one pair of the first insulating patterns 15 adjacent to each other on the respective first to fourth row lines RL1 to RL4, the second gap fill pattern 24 may be disposed between one pair of the data storage structures 40. The second gap fill pattern 24 may be disposed between the second insulating patterns 33.

The lower electrode 41L may be formed of a conductive material. For example, the lower electrode 41L may include TiN, TiAlN, TaN, WN, MoN, TiSiN, ZrSiN, WSiN, WBN, ZrAlN, MoAlN, TaSiN, TaAlN, TiON, TiAlON, WON, TaON, or combinations thereof, and/or formed of a carbon-based conductive material. The carbon-based conductive material may be a material including carbon (C), CN, TiCN, TaCN, or combinations thereof.

The data storage pattern 42 may be formed of a material capable of storing data using a resistance change. For example, the data storage pattern 42 may be formed of a phase-change memory material in which a phase may be changed from a noncrystalline phase having a relatively high specific resistance to a crystalline phase having a relatively low specific resistance, or from a crystalline phase to a noncrystalline phase by heating the material using an applied current. The phase change memory material may be a chalcogenide material including germanium (Ge), antimony (Sb), and/or tellurium (Te). The phase change memory material may be a material including at least one of Te or Se, and at least one of germanium (Ge), antimony (Sb), bismuth (Bi), lead (Pb), tin (Sn), arsenic (As), sulfur (S), silicon (Si), phosphorus (P), oxygen (O), nitrogen (N) or indium (In). In addition, the phase change memory material may also be a material having a superlattice structure, that may be formed by the repetitive stacking of GsTe—SbTe and may be an In—Sb—Te (IST) material, or a Bi—Sb—Te (BST) material.

In an exemplary embodiment, the upper electrode 43 may be formed of a conductive material including TiN, TiAlN, TaN, WN, MoN, TiSiN, TiBN, ZrSiN, WSiN, WBN, ZrAlN, MoAlN, TaSiN, TaAlN, TiON, TiAlON, WON, TaON, or combinations thereof, and/or a carbon-based conductive material.

In an exemplary embodiment, the spacers 21a and the spacer connection portion 21b may be formed of a insulating material such as silicon oxide, having etching selectivity with the first and second insulating patterns 15 and 33.

Switching structures 50 may be disposed on the upper electrodes 43. A gap fill insulating layer 64 may be disposed between the switching structures 50.

Each of the switching structures 50 may include a lower switching electrode 51, a switch 52, and an upper switching electrode 53 stacked sequentially. The lower switching electrode 51 may be electrically connected to the upper electrode 43 of the data storage structure 40.

In an exemplary embodiment, the lower switching electrode 51 and the upper switching electrode 53 may be formed TiN, TiAlN, TaN, WN, MoN, TiSiN, TiBN, ZrSiN, WSiN, WBN, ZrAlN, MoAiN, TaSiN, TaAlN, TiON, TiAlON, or a conductive material including combinations thereof, and/or a carbon-based conductive material.

The switch 52 may be formed of a threshold switching material. For example, the switch 52 may be formed of an ovonic threshold switching material.

The switch 52 may be formed of a chalcogenide material that is different from a chalcogenide material that may be used for the data storage patterns 42. For example, the data storage pattern 42 may be formed of a phase-change memory material, such as an alloy of Ge, Sb and/or Te, in which a phase may be changed from a crystalline phase to an amorphous phase or from an amorphous phase to a crystalline phase during operation of the semiconductor device 1, such as a PRAM or the like. The data storage pattern 42 may be formed of a chalcogenide-based ovonic threshold switching material capable of maintaining an amorphous phase during operation of the semiconductor device 1. The switch 52 may maintain an amorphous phase even in the case of being switched from an OFF state to an ON state by an applied voltage having a level equal to or higher than that of a threshold voltage.

In an exemplary embodiment, the switch 52 may include an alloy material including at least two or more elements among As, S, Se, Te, and Ge elements, or an additional element in addition to this alloy material. For example, the switch may also include a Si element, are N element, or the like, which may maintain a noncrystalline phase at a relatively high temperature. Alternatively, the switch 52 may be formed of any one of an alloy material including Te, As, Ge and Si, an alloy material including Ge, Te and Pb, an alloy material including Ge, Se and Te, an alloy material including Al, As and Te, an alloy material including Se, As, Ge and Si, an alloy material including Se, As, Ge and C, an alloy material including Se, Te, Ge and Si, an alloy material including Ge, Sb, Te and Se, an alloy material including Ge, Bi, Te and Se, an alloy material including Ge, As, Sb and Se, an alloy material including Ge, As, Bi and Te, or an alloy material including Ge, As, Bi and Se. As the threshold switching device, the switch 52 may be formed of a material including any one of AsTeGeSiIn, GeTe, SnTe, GeSe, SnTe, GeSe, SnSe, AsTeGeSiIn, AsTeGeSiSbS, AsTeGeSiIn, AsTeGeSiIP, AsTeGeSi, As2Te$_3$Ge, As$_2$Se$_3$Ge, As$_{25}$(Te$_{90}$Ge$_{10}$)$_{75}$, Te$_{40}$As$_{35}$Si$_{18}$Ge$_{6.75}$In$_{0.25}$, Te$_{28}$As$_{34.5}$Ge$_{15.5}$S$_{22}$, Te$_{39}$As$_{36}$Si$_{17}$Ge$_7$P, As$_{10}$Te$_{21}$S$_2$Ge$_{15}$Se$_{50}$Sb$_2$, Si$_5$Te$_{34}$As$_{28}$Ge$_{11}$Se$_1$, AsTeGeSiSeNS, AsTeGeSiIn, AsTeGeSiP, AsSe, AsGeSe, AsTeGeSe, AsTeGeSi, ZnTe, N treated OTS, TeAsGeSi, GeTePb, GeSeTe, AlAsTe, SeAsGeSi, SeAsGeC, SeTeGeSi, GeSbTeSe, GeBiTeSe, GeAsSBSe, GeAsBiTe, GeAsBiSe, AsSe, AsSeGe, AsSeGeTe, AsGeTeSi, or GexSe1x.

The switch 52, as the threshold switching device, may be switched from an Off state to an On state when a voltage having a level equal to or higher than that of the threshold voltage is applied. Therefore, the switch 52, as the threshold switching device, may be used as a switching device of a memory cell of a semiconductor device, such as a phase-change memory element or a resistance memory element.

The gap fill insulating layer 64 may be formed of an insulating material such as silicon nitride.

The data storage structure 40 and the switching structure 50 may constitute each of the first to sixteenth memory cells MC1 to MC16. The first to sixteenth memory cells MC1 to MC16 may be divided into first and second subcells. For example, the first to eighth memory cells MC1 to MC8 may constitute the first subcells, and the ninth to sixteenth memory cells MC9 to MC16 may constitute the second subcells. In an example, the first subcells MC1 to MC8 may be dummy memory cells that are not used for actual data storage. The second subcells MC9 to MC16 may be main memory cells that are used for actual data storage.

The first to fourth column lines CL1 to CL4 may be disposed on the switching structure 50 and the gap fill insulating layer 64, to extend in the second direction (e.g., a Y-axis direction), and to be spaced apart from each other in the first direction (e.g., an X-axis direction), perpendicular to the second direction.

The first to fourth column lines CL1 to CL4 may be formed of a conductive material. For example, the first to fourth column lines CL1 to CL4 may be formed of a metal, such as tungsten, copper, titanium, or the like.

Third gap fill patterns 133 may be disposed between the first to fourth column lines CL1 to CL4. The third gap fill patterns 133 may extend in the second direction (e.g., a Y-axis direction). The third gap fill patterns 133 may intersect the first gap fill patterns 13 and the second insulating patterns 33. The third gap fill patterns 133 may be formed of an insulating material, such as silicon nitride.

The column lines CL1 to CL4 may intersect the row lines RL1 to RL4. Each of the column lines CL1 to CL4 may be disposed between a pair of adjacent third gap fill patterns 133.

Each of the column lines CL1 to CL4 may include first and second upper conductive layers 71 and 72 sequentially stacked. Each side of the first and second upper conductive layers 71 and 72 may be vertically aligned.

Figure 3:
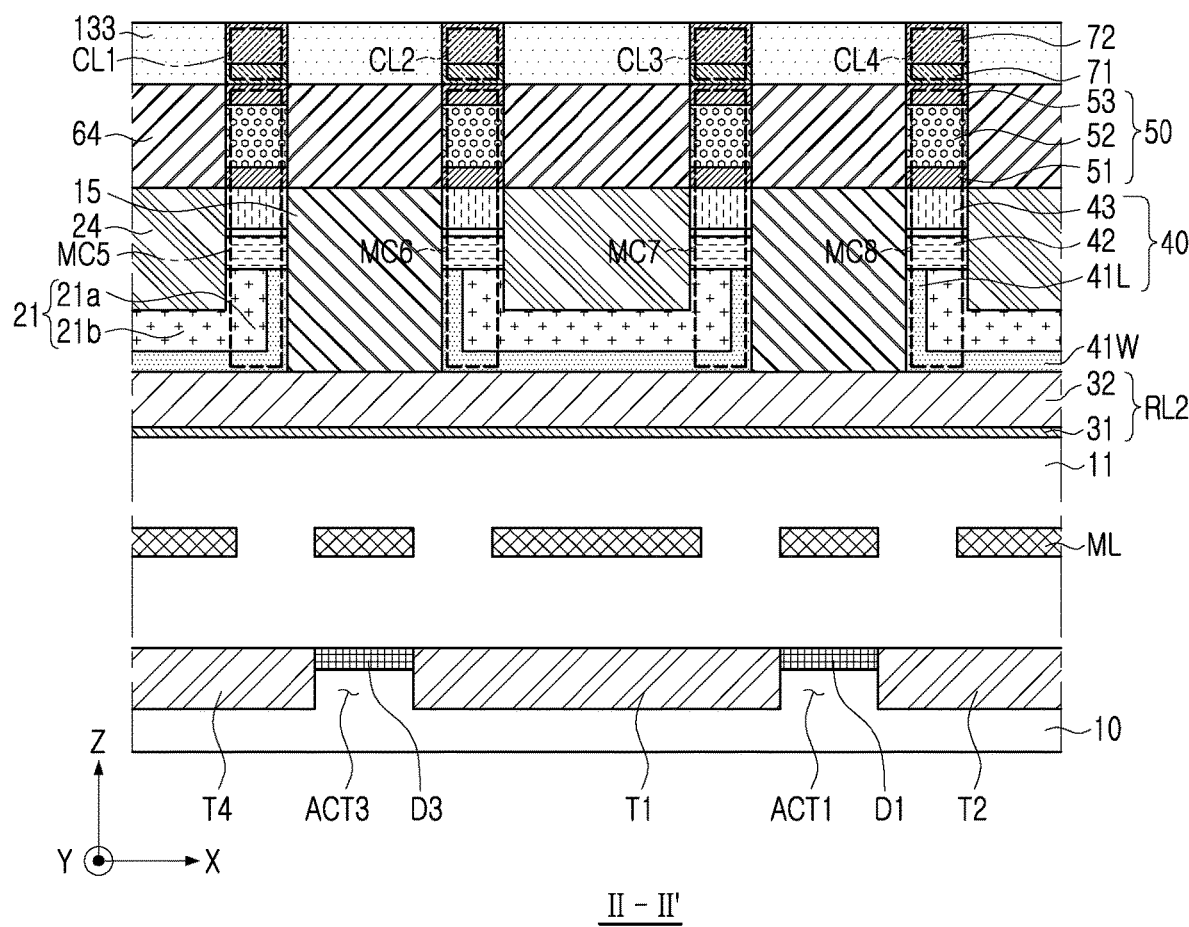

In an exemplary embodiment, the first and second row lines RL1 and RL2, as the dummy word lines, may have a lower structure floated from both Hype and n-type active regions by not including at least one of first and second contact plugs CW1 and CW2. For example, the first contact plug CW1, for connecting a portion of the circuit wirings ML in the base insulating layer 11 to a first lower conductive layer 31 of each of the first and second row lines RL1 and RL2, may not be formed above the portion of the circuit wirings ML. Alternatively, a second contact plug CW2, for connecting the portion of the circuit wirings ML to both the p-type active region and the n-type active region, may not be formed below the portion of the circuit wirings ML. Alternatively, as shown in FIGS. 3 and 5, both the first and second contact plugs CW1 and CW2 may not be formed below each of the first and second row lines RL1 and RL2.

In an exemplary embodiment, the first and second row lines RL1 and RL2 may have a lower structure connected to both p-type and n-type active regions, that is the same as a lower structure of the third and fourth row lines RL3 and RL4. Referring to FIGS. 6 and 7, the first and second contact plugs CW1 and CW2 may be formed below the second row line RL2 as the dummy word line. The second row line RL2 may be connected to first and third active regions ACT1 and ACT3 via the first and second contact plugs CW1 and CW2. In an exemplary embodiment, the first and third active regions ACT1 and ACT3 may be p-type and n-type active regions. Also, the first and second contact plugs CW1 and CW2 may be formed below the first row line RL2 as the dummy word line, and the first row line RL1 may be connected to both p-type and n-type active regions via the first and second contact plugs CW1 and CW2.

The first and second word lines RL1 and RL2 may have a lower structure floated from both p-type and n-type active regions. Also the first and second word lines RL1 and RL2 may have a same lower structure as that of the third and fourth word lines RL3 and RL4. Accordingly, recesses of the main memory cells MC9 to MC16, which may occur when a data storage pattern is formed using a polishing process such as chemical mechanical polishing (CMP), may be prevented.

For example, when the first and second row lines RL1 and RL2 have a lower structure floated from both p-type and n-type active regions the recess region R may not be formed in the data storage pattern 42 formed on the third and fourth row lines RL3 and RL4, as illustrated in FIG. 4. In this case, the height h of each of the recess regions R included in the data storage patterns 42c3 and 42c4 of the first sublines RL1 and RL2 may be increased by being spaced apart from the third and fourth row lines RL1 and RL4 in the second direction (e.g., the Y direction). For example, the height h1 of the recess region R included in the fourth memory cell MC4 may be greater than the height h2 of the recess region included in the eighth memory cell MC8.

Figure 8:
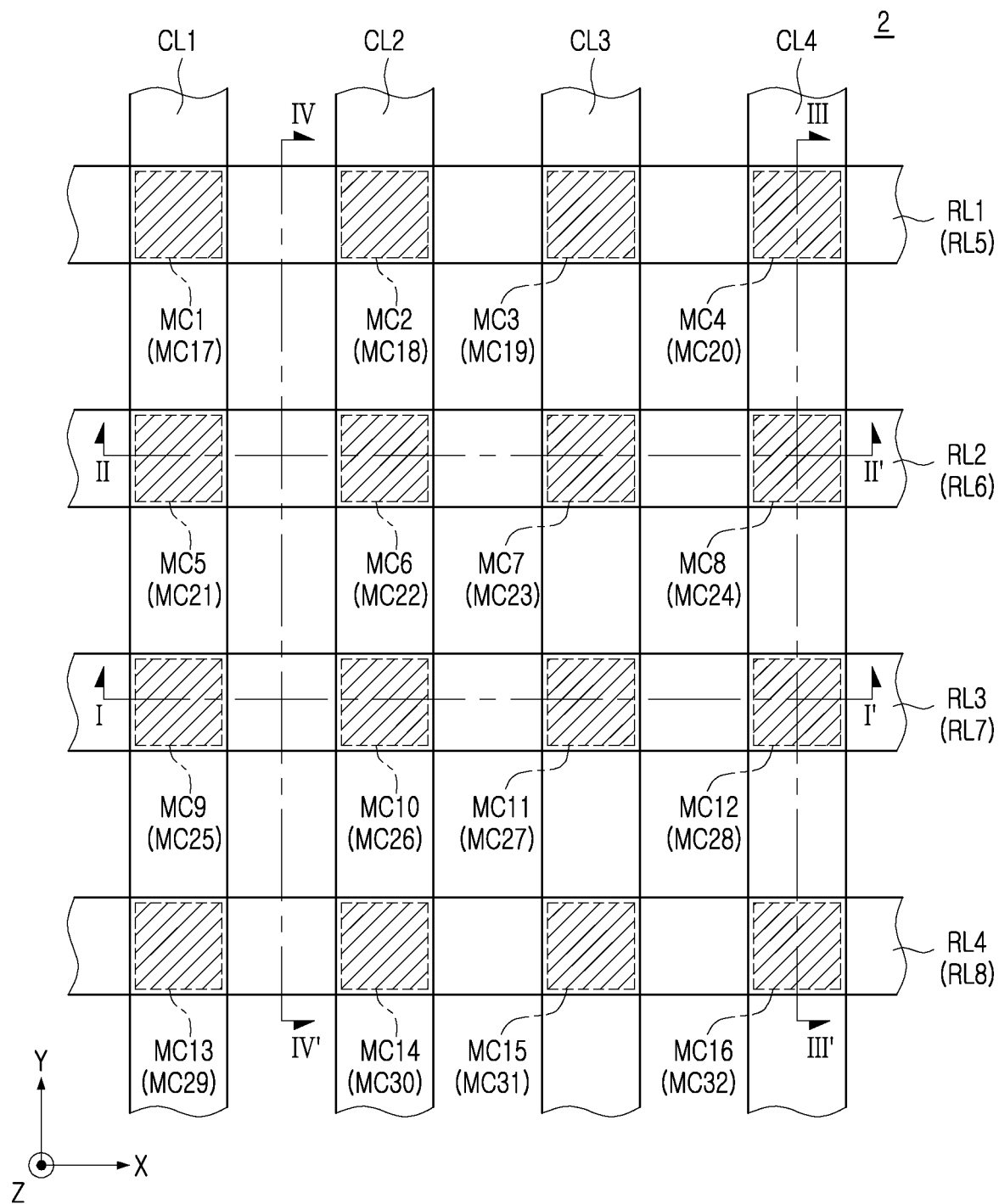
FIG. 8 is a plan view of a semiconductor device according to an exemplary embodiment of the present inventive concepts.
Figure 9:
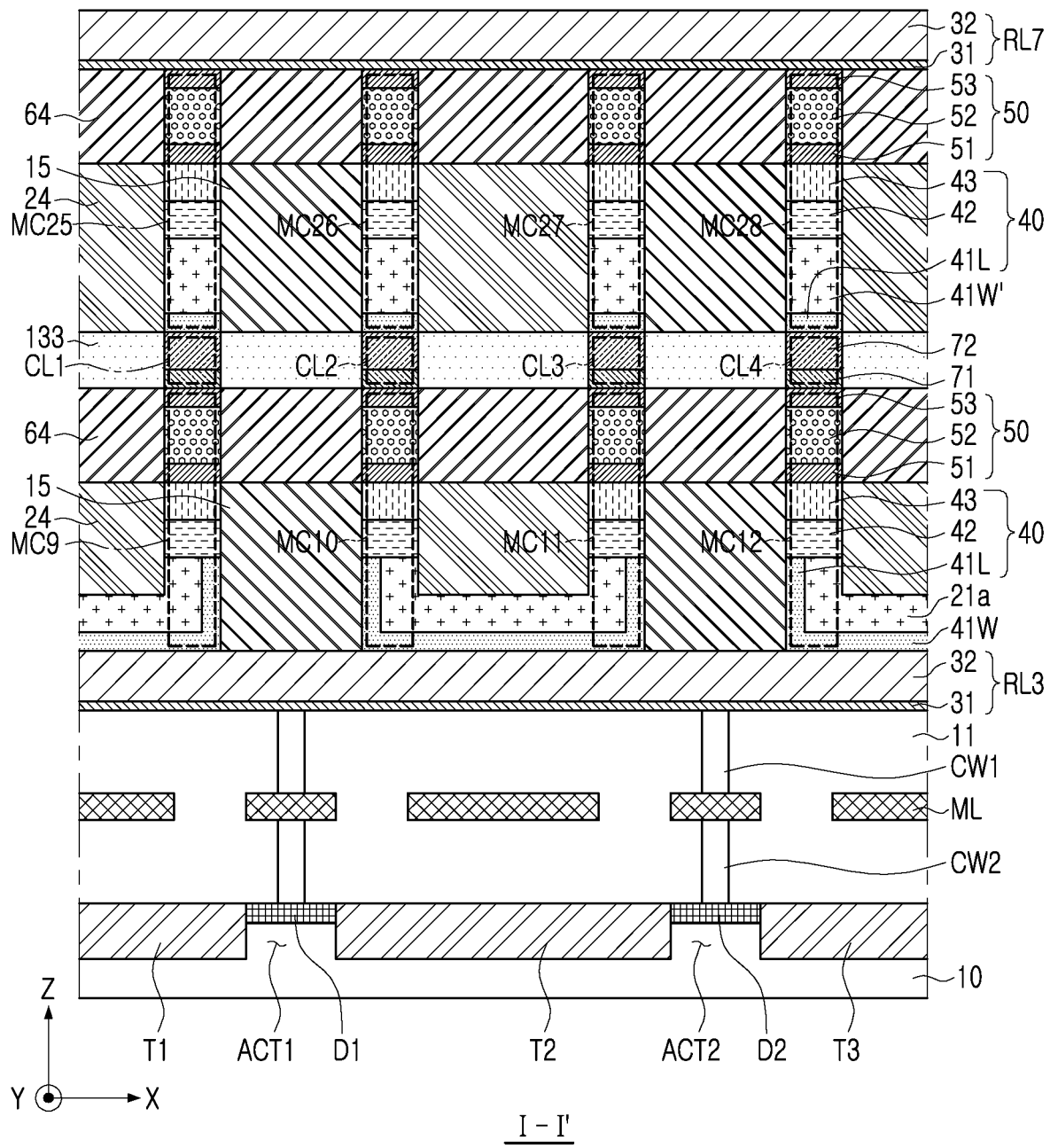
FIGS. 9, 10, 11 and 12 are cross-sectional views of a semiconductor device taken along lines I-I', II-II', III-III' and IV-IV' of FIG. 8, respectively, according to exemplary embodiments of the present inventive concepts.

FIG. 8 is a plan view illustrating a semiconductor device according to an exemplary embodiment.

Referring to FIG. 8, a semiconductor device 2 may have a dual structure in which two memory cells are disposed in a third direction (e.g., a Z-axis direction), in an overlapping manner. For example, the seventeenth memory cell MC17 may be disposed on the first memory cell MC1, and the eighteenth memory cell MC18 may be disposed on the second memory cell MC2.

In an exemplary embodiment, the semiconductor device 2 may include first to eighth row lines RL1 to RL8, first to fourth column lines CL1 to CL4, and first to thirty second memory cells MC1 to MC32 disposed between the first to eighth row lines RL1 to RL8 and the first to fourth column lines CL1 to CL4. However, the number of row lines, column lines and memory cells are not limited thereto.

In an exemplary embodiment, the first to eighth row lines RL1 to RL8 may be word lines, and the first to fourth column lines CL1 to CL4 may be bit lines. Further, the first to eighth memory cells MC1 to MC8 and the seventeenth to twenty-fourth memory cells memory cells MC17 to MC24 may be dummy memory cells, and the ninth to sixteenth memory cells MC9 to MC16 and the twenty-fifth to thirty-second memory cells MC25 to MC32 may be main memory cells.

The first to fourth row lines RL1 and RL4 may be disposed on a base insulating layer, to extend in the first direction (e.g., the X-axis direction), and to be spaced apart from each other in the second direction (e.g., the Y-axis direction), perpendicular to the first direction.

The fifth to eighth row lines RL5 to RL8 extend in the first direction parallel to the first to fourth row lines RL1 to RL4 may be disposed on the first to fourth row lines RL1 to RL4. Each of the fifth to eighth row lines RL5 to RL8 may correspond one-to-one with each of the first to fourth row lines RL1 to RL4. Each of the fifth to eighth row lines RL5 to RL8 may be vertically aligned with a predetermined gap in the third direction (e.g., the Z-axis direction) with respect to each of the first to fourth row lines RL1 to RL4.

The first to eighth row lines RL1 to RL8 may be formed of a conductive material. For example, the first to eighth row lines RL1 to RL8 may be formed of a metal, such as tungsten (W), copper (Cu), titanium (Ti), or the like.

The first to fourth column lines CL1 to CL4 extending in the second direction may be disposed between the first to fourth row lines RL1 to RL4 and the fifth to eighth row lines RL5 to RL8. The first to fourth column lines CL1 to CL4 may be spaced apart from the first to fourth row lines RL1 to RL4 and the fifth to eighth row lines RL5 to RL8 in the third direction.

The first to eighth row lines RL1 to RL8 and the first to fourth column lines CL1 CL4 may form a mesh structure on the XY plane.

The first to sixteenth memory cells MC1 to MC16 may be disposed between the first to fourth row lines RL1 to RL4 and the first to fourth column lines CL1 to CL4. The seventeenth to thirty-second memory cells MC17 to MC32 may be disposed between the first to fourth column lines CL1 to CL4 and the fifth to eighth row lines RL5 to RL8.

The first to eighth row lines RL1 to RL8 may be divided into first and second sublines. For example, the first, second, fifth and sixth row lines RL1, RL2, and RL6 may constitute the first subline, and the third, fourth, the seventh and eighth row lines RL3, RL4, RL7 and RL8 may constitute the second subline. In an exemplary embodiment, the first sublines RL1, RL2, RL5 and RL6 may be dummy word lines in which dummy memory cells that do not store data are disposed in an upper portion thereof. The second sublines RL3, RL4, RL7 and RL8 may be main word lines in which main memory cells that store data are disposed in an upper portion thereof.

Each of the first to sixteenth memory cells MC1 to MC16 may correspond to each of the seventeenth to thirty-second memory cells MC17 to MC32. For example, the first memory cell MC1 may correspond to the seventeenth memory cell MC17 formed on an upper portion thereof. The sixteenth memory cell MC16 may correspond to the thirty-second memory cell MC32 formed on an upper portion thereof.

FIGS. 9 to 12 are cross-sectional views of the semiconductor device according to exemplary embodiments, taken along lines I-I', II-II', III-III', and IV-IV' of FIG. 8, respectively.

Figure 13:
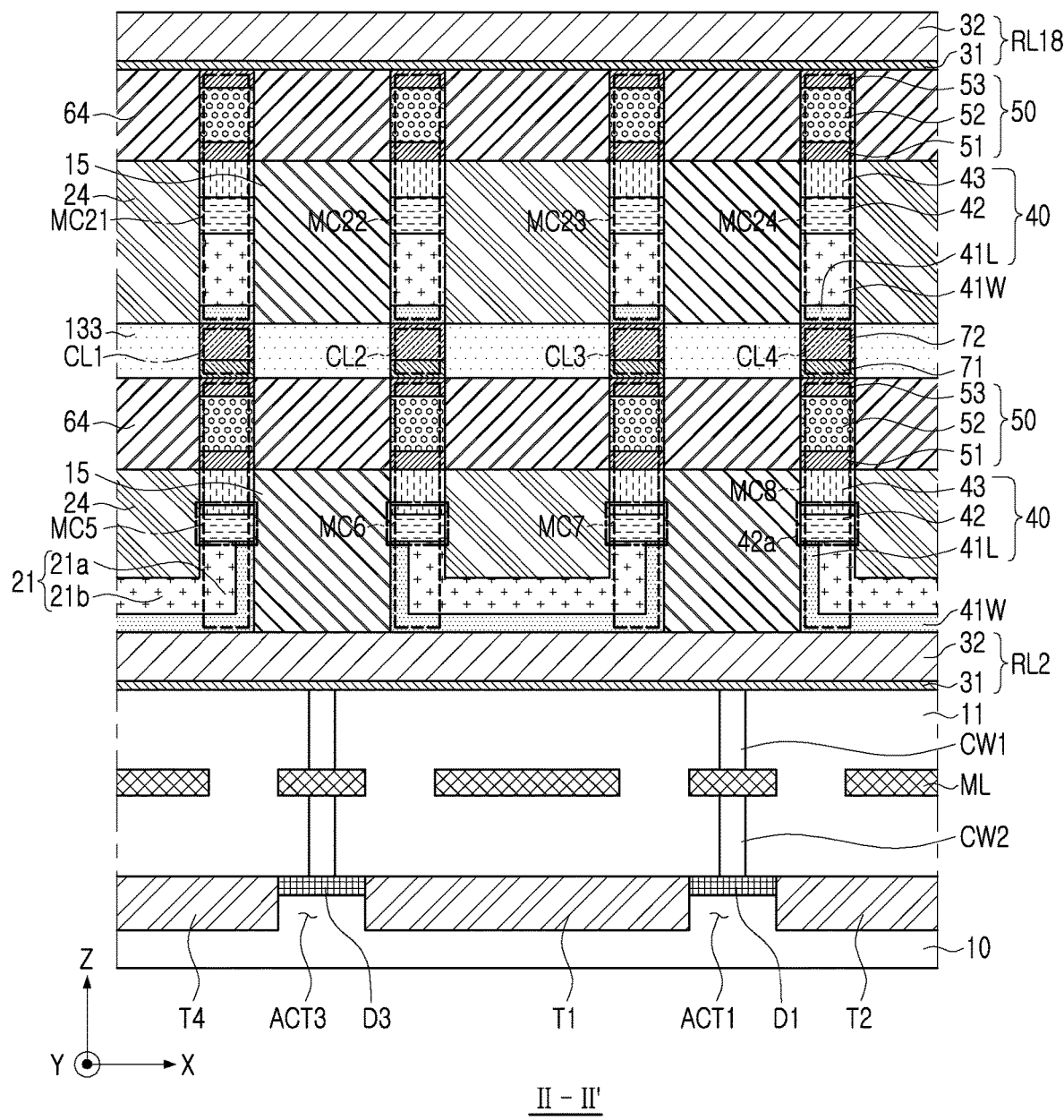
FIGS. 13 and 14 are cross-sectional views of a semiconductor device taken along lines II-II' and IV-IV' of FIG. 8, respectively, according to exemplary embodiments of the present inventive concepts.
Figure 14:
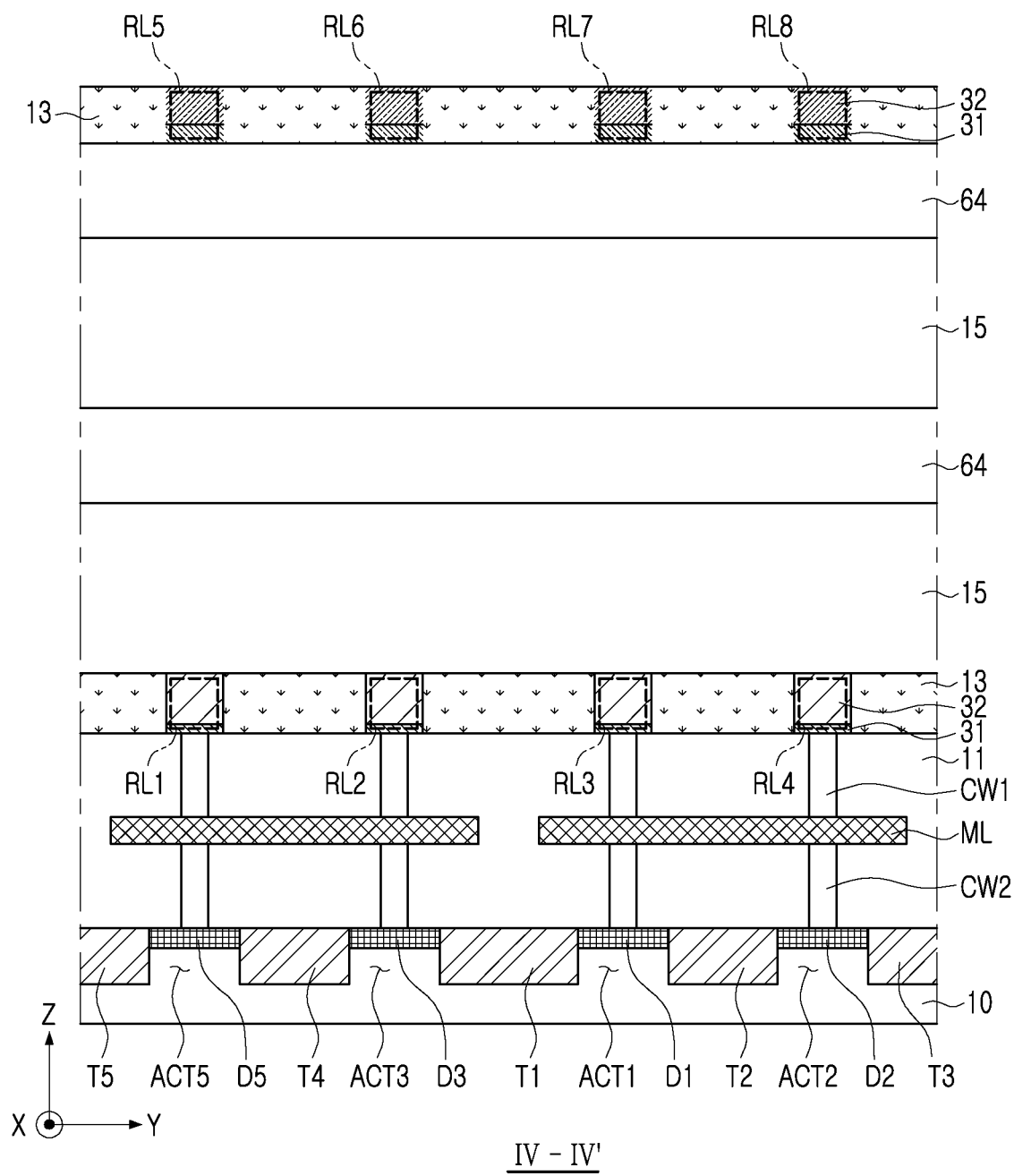

FIGS. 13 and 14 are cross-sectional views of the semiconductor device according to exemplary embodiments, taken along II-II' and IV-IV' FIG. 8, respectively.

Referring to FIGS. 9 to 12, a plurality of active regions ACT1 to ACT5 isolated by the plurality of isolation films T1 to T6 may be defined in the substrate 10. The impurity regions D1 to D5 may be formed in the active regions ACT1 to ACT5 using an ion implantation process or the like. Each of the impurity regions D1 to D5 may be a p-type impurity region or an n-type impurity region.

At least one transistor may be formed in each of the first to fifth active regions ACT1 to ACT5 using the impurity regions D1 to D5. In some examples, the first and fifth active regions ACT1 and ACT5 may be the Hype active regions including the p-type impurities, and the second, third, and fourth active regions ACT2, ACT3 and ACT4 may be the n-type active regions including the n-type impurities. In this case, a PMOS transistor may be formed in each of the first and fifth active regions ACT1 and ACT5, and a NMOS transistor may be formed in each of the second, third, and fourth active regions ACT2, ACT3 and ACT4.

A base insulating layer 11 may be disposed on the substrate 10. The base insulating layer 11 may be formed of an insulating material, such as silicon oxide.

A plurality of circuit wirings ML may be disposed in the base insulating layer 11. Also, a plurality of contact plugs CW1, CW2 connected to a portion of the circuit wirings ML may be disposed in the base insulating layer 11.

The first to thirty-second memory cells MC1 to MC32 may have the same structure as the memory cells of the semiconductor device 1 described above with reference to FIGS. 1 to 7. For example, each of the first to thirty-second memory cells MC1 to MC32 may include the data storage structure 40 and the switching structure 50.

The data storage structure 40 may include a lower electrode 41L, a data storage pattern 42, and an upper electrode 43. The data storage pattern 42 may be formed of a material capable of storing data by using a resistance change. For example, the data storage pattern 42 may be formed of a phase change memory material. In an exemplary embodiment, the phase change memory material may be a chalcogenide material including Ge, Sb and/or Te. The phase change memory material may be a material including at least one of Te or Se and at least one of Ge, Sb, Bi, Pb, Sn, As, S, Si and P. The phase change memory material may also be a material having a super lattice structure, an In—Sb—Te (IST) material, or a Bi—Sb—Te (BST) material, which may be formed by repetitive stacking of GsTe. The lower electrode 41L and the upper electrode 43 may be formed of a conductive material such as a metal.

The switching structure 50 may include a lower switching electrode 51, a switch 52, and an upper switching electrode 53. The lower switching electrode 51 may be electrically connected to the upper electrode 43 of the data storage structure 40 to form an intermediate electrode of each of the first to thirty-second memory cells MC1 to MC32. The switch 52 may be formed of a threshold switching material. For example, the switch 52 may be formed of an ovonic threshold switching material.

Figure 10:
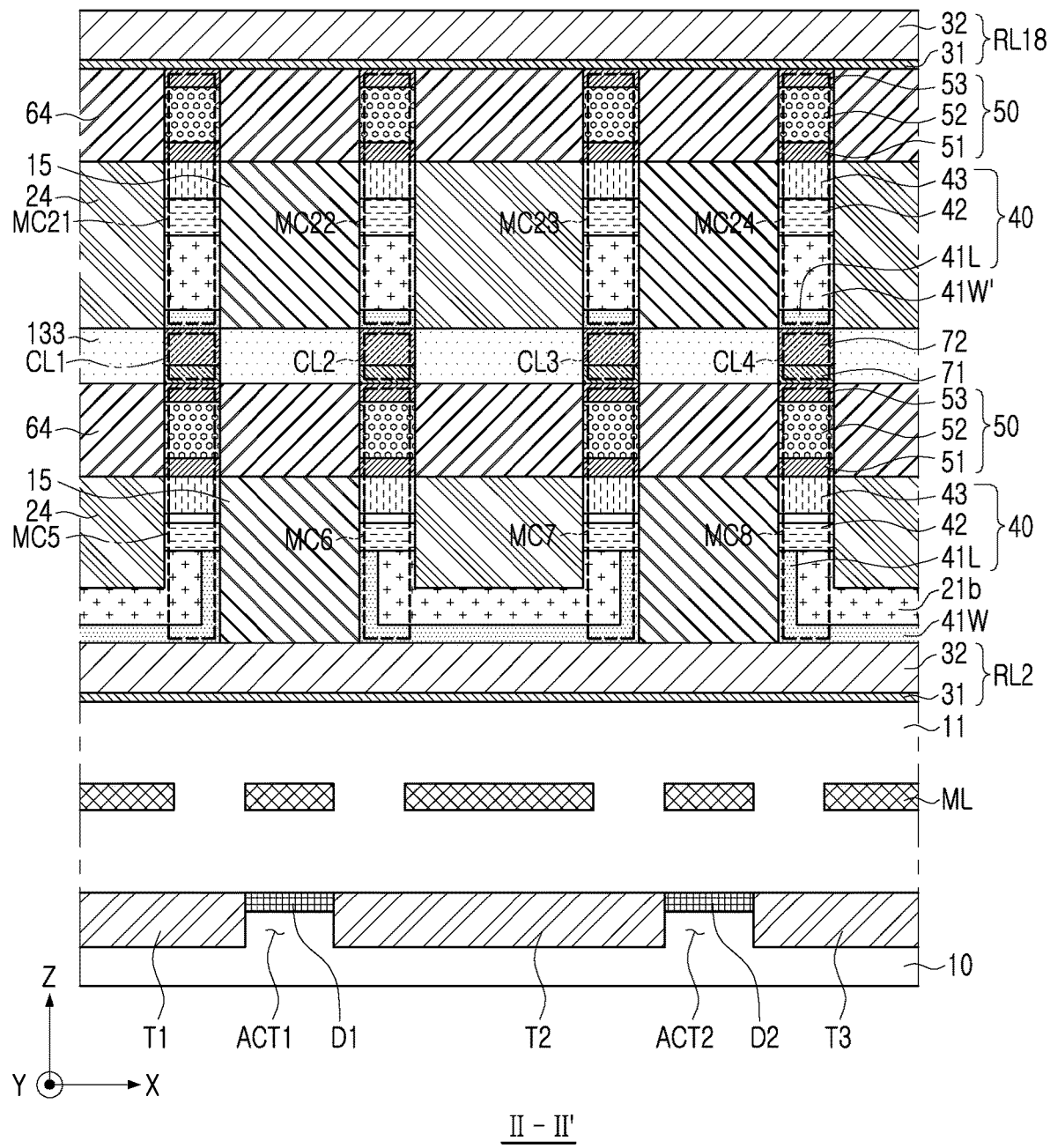
Figure 11:
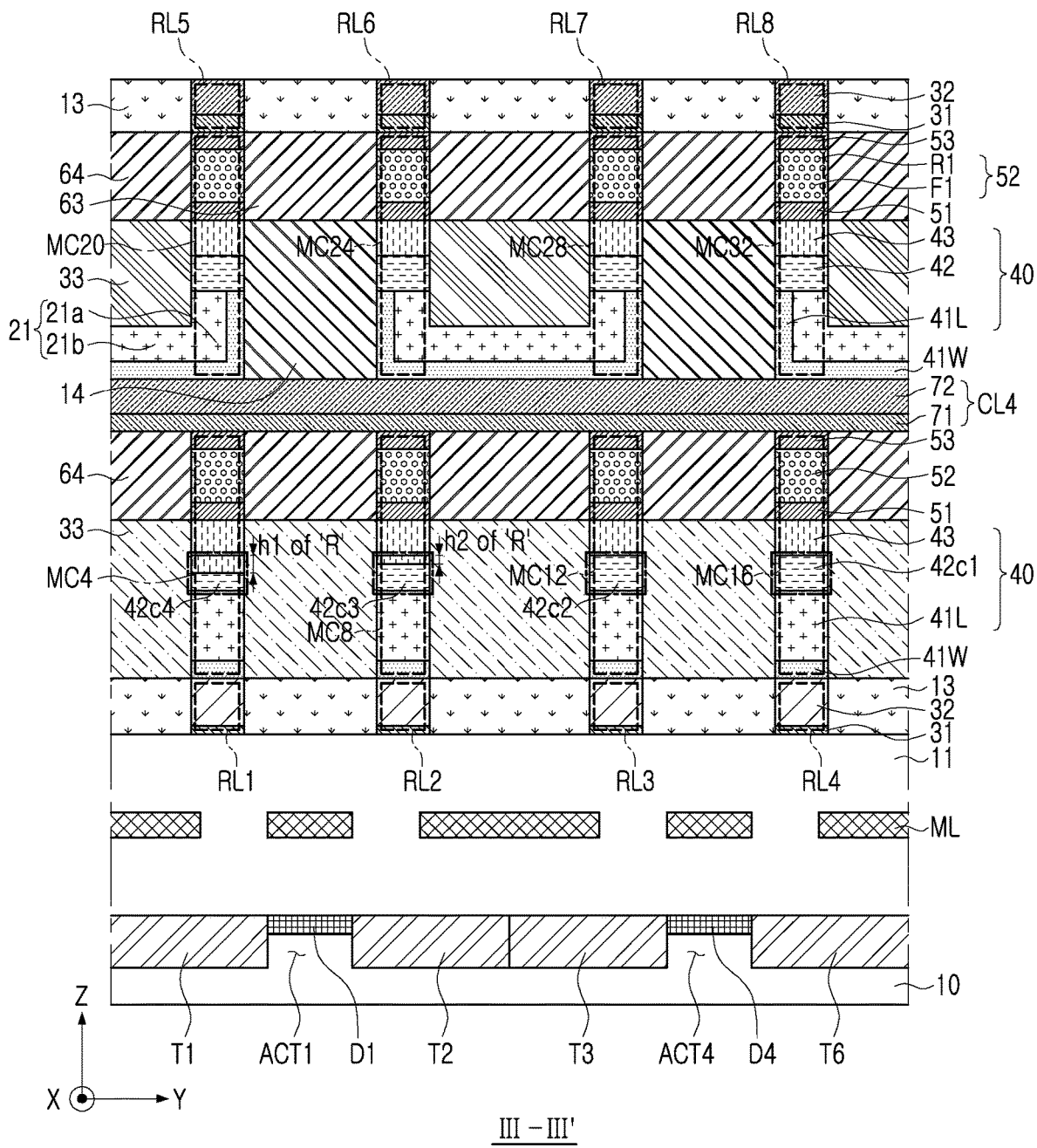

In an exemplary embodiment, the first sublines RL1, RL2, RL5 and RL6 may have a lower structure floated from both p-type and n-type active regions. For example, a first contact plug CW1 for connecting a portion of the circuit wirings ML in the base insulating layer 11 to the first lower conductive layer 31, may not be formed below the first sublines RL1, RL2, RL5 and RL6. Alternatively, a second contact plug CW2 for connecting a portion of the circuit wirings ML in the base insulating layer 11 to both p-type and n-type active regions, may not be formed below the first sublines RL1, R2, RL5 and RL6. Also, as shown in FIGS. 10 and 12, both the first and second contact plugs CW1 and CW2 may not be formed below the first sublimes RL1, RL2, RL5, and RL6.

In an exemplary embodiment, the first sublines RL1, RL2, RL5 and RL6 may have the same lower structure as the second sublines RL3, RL4, RL7 and RL8. Referring to FIGS. 13 and 14, the first sublines RL1, RL2, RL5, and RL6 may have a lower structure connected to both the p-type active regions (e.g., the first and fifth active regions ACT1 and ACT5) and the n-type active regions (e.g., the second to fourth active regions ACT2 to ACT4). The first contact plug CW1 for connecting a portion of the circuit wirings ML in the base insulating layer 11 to the first lower conductive layer 31, may be disposed below the first sublines RL1, RL2, RL5 and RL6. The second contact plug CW2 for connecting a portion of the circuit wirings ML in the base insulating layer 11 to both the first and second active regions ACT1 and ACT2, may be disposed below the second sublines RL3, RL4, RL7 and RL8.

The first sublines RL1, RL2, RL5 and RL6 may have the same lower structure as the second sublines RL3, RL4, RL7 and RL8. Also, the first sublines RL1, RL2, RL5 and RL6 may also have a lower structure floated from both the p-type and n-type active regions. Accordingly, recesses of the main memory cells MC9 to MC16 and MC25 to MC32, which may occur when the data storage pattern is formed using the chemical mechanical polishing (CMP) process, may be prevented.

Figure 12:
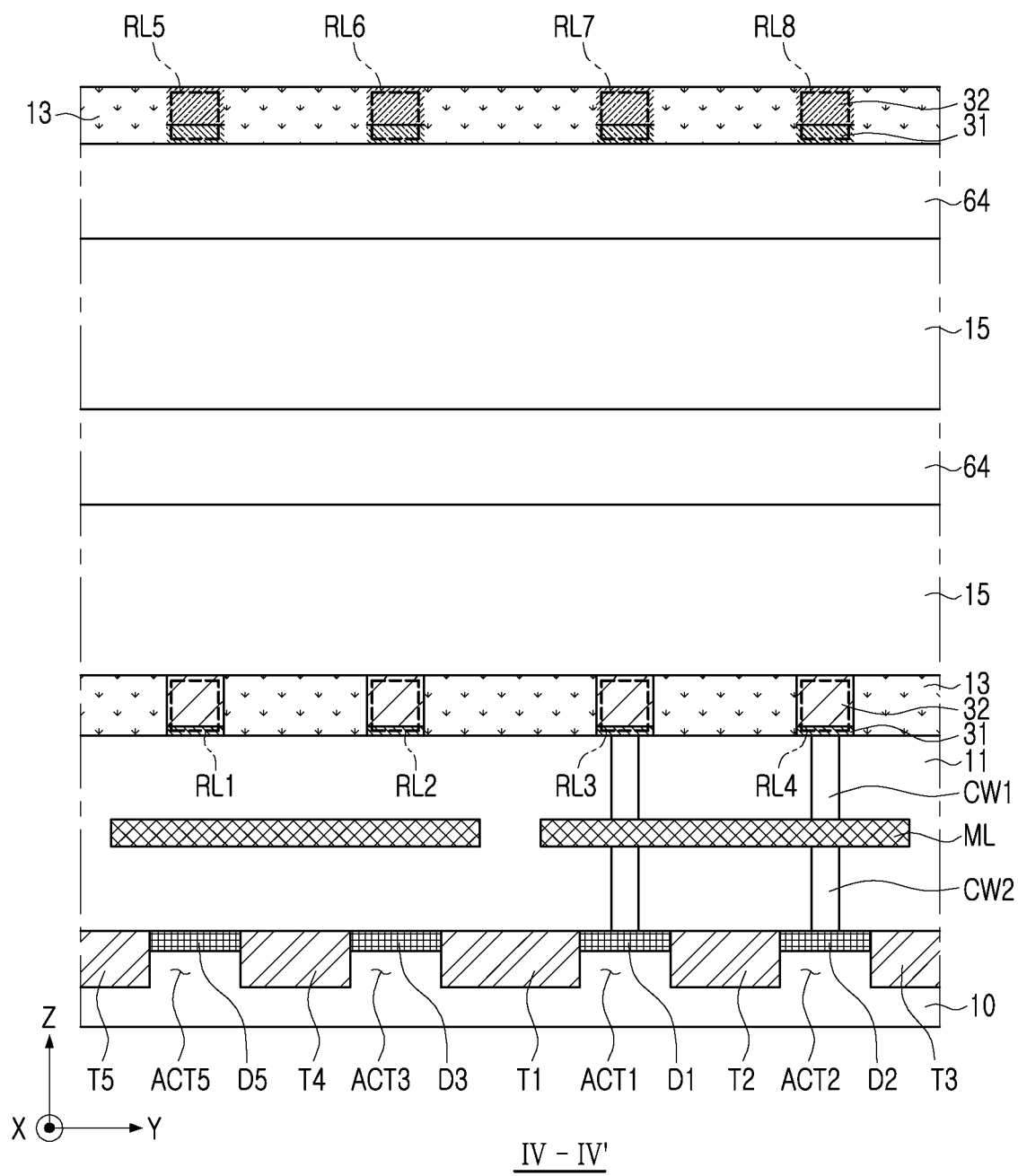

For example, when the first sublines RL1, RL2, RL5, and RL6 have a lower structure that is floated from the fifth and third active regions ACT5 and ACT3, as illustrated FIG. 12, the recess regions R may not be formed in the data storage patterns 42c1 and 42c2 of the main memory cells MC12 and MC16. In this case, the height h of each of the recess regions R may be increased by being spaced apart from the second sublines RL3, RL4, RL7 and RL8 in the second direction (e.g., the Y direction). For example, the height h1 of the recess region included in the fourth memory cell MC4 may be greater than the height h2 of the recess region included in the eighth memory cell MC8.

Hereinafter, a method of manufacturing a semiconductor device according to an exemplary embodiment will be described in detail with reference to FIGS. 15 to 22.

FIGS. 15 to 22 are cross-sectional views illustrating a method of manufacturing a semiconductor device according to an exemplary embodiment.

Figure 15:
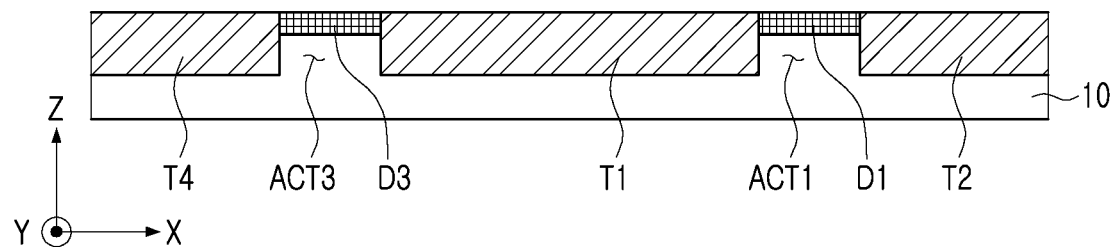
FIGS. 15 to 22 are cross-sectional views illustrating a method of manufacturing a semiconductor device according to exemplary embodiments of the present inventive concepts.

Referring to FIG. 15, a plurality of isolation films T1, T2, T3 may be formed on a substrate 10. A plurality of active regions ACT1 and ACT2 may be defined by the plurality of the isolation films T1, T2, T3. Impurity regions D1 and D2 may be formed in the respective active regions ACT1 and ACT2 using an ion implantation process or the like. Each of the impurity regions D1 and D2 may be formed with a source region and a drain region, in the formation of a transistor. The impurity regions D1 and D2 may include at least one of an n-type impurity region and a p-type impurity region depending on the type of the impurity.

Figure 16:
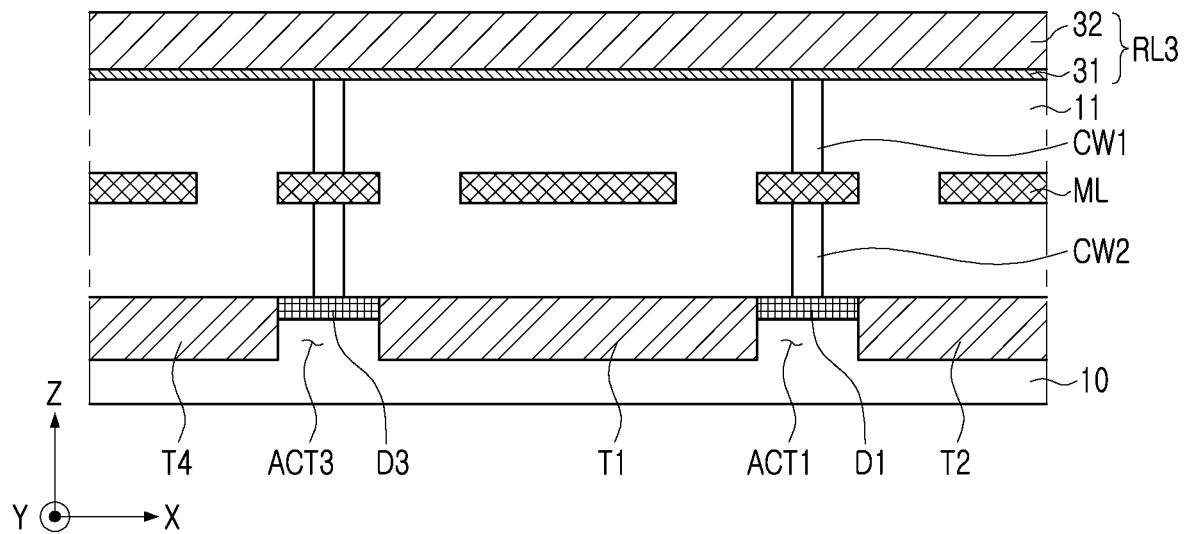

Referring to FIG. 16, a base insulating layer 11 may be formed on the substrate 10. The substrate 10 may be a semiconductor substrate, and the base insulating layer 11 may be formed of an insulating material, such as silicon oxide. After a plurality of circuit transistors are formed on the substrate 10, the base insulating layer 11 may be formed.

A plurality of circuit wirings ML and a plurality of contact plugs, CW1, CW2, may be formed in the base insulating layer 11.

A third row line RL3 extending in a first direction (e.g., the X-axis direction) may be formed on the base insulating layer 11. The third row line RL3 may include a first lower conductive layer 31 and a second lower conductive layer 32, sequentially stacked.

First gap fill patterns may be formed to fill a gap between the third row line RL3 and the row lines adjacent to each other in the second direction (e.g., the Y-axis direction), perpendicular to the first direction. The first gap fill patterns may be formed of silicon oxide or silicon nitride.

Figure 17:
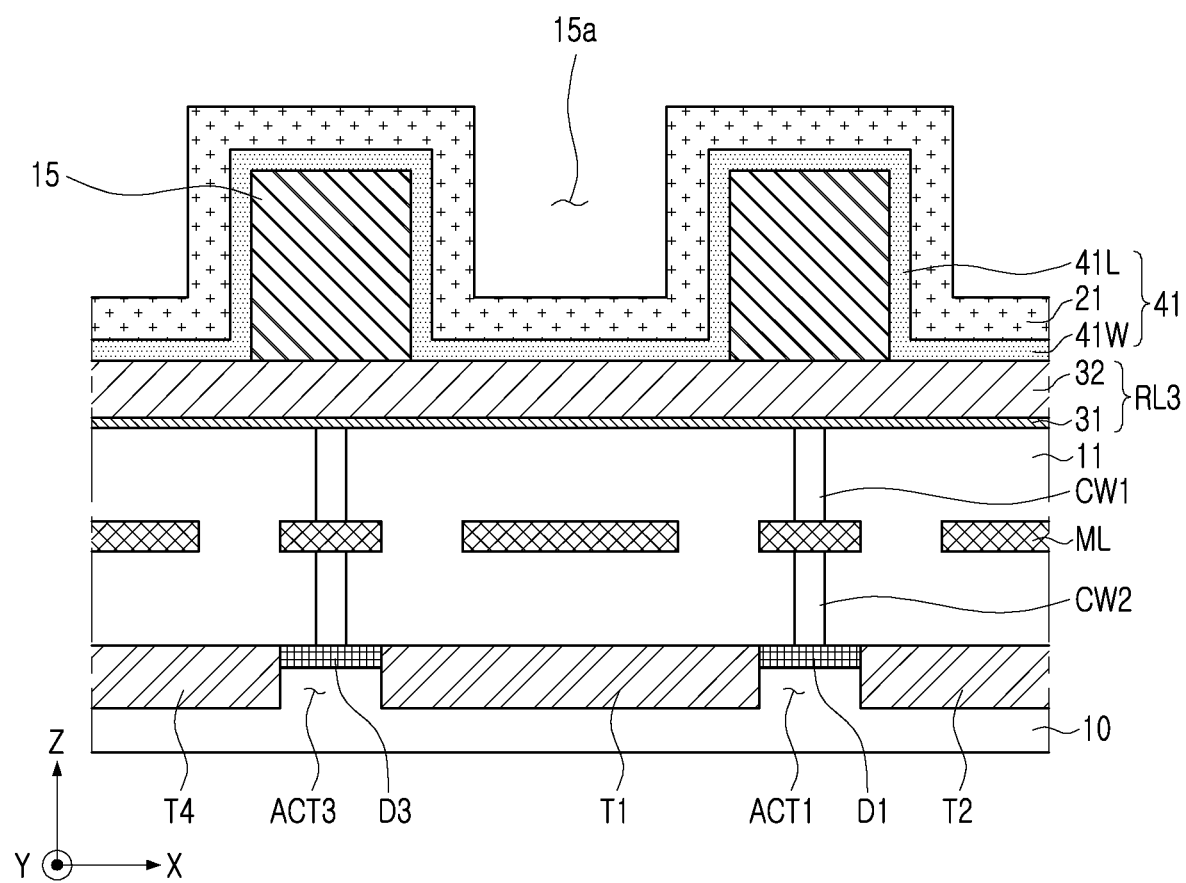

Referring to FIG. 17, first insulating patterns 15 may be formed on the third row line RL3 and the first gap fill patterns. The first insulating patterns 15 may have an opening 15a having a linear shape. The opening 15a of the first insulating patterns 15 may have a linear shape extending in a second direction, for example, the Y-axis direction, perpendicular to the third row line RL3.

A lower electrode layer 41 may be formed to conformally cover the first insulating patterns 15. A spacer layer 21 having a thickness greater than that of the lower electrode layer 41 may be conformally formed on the lower electrode layer 41.

Figure 18:
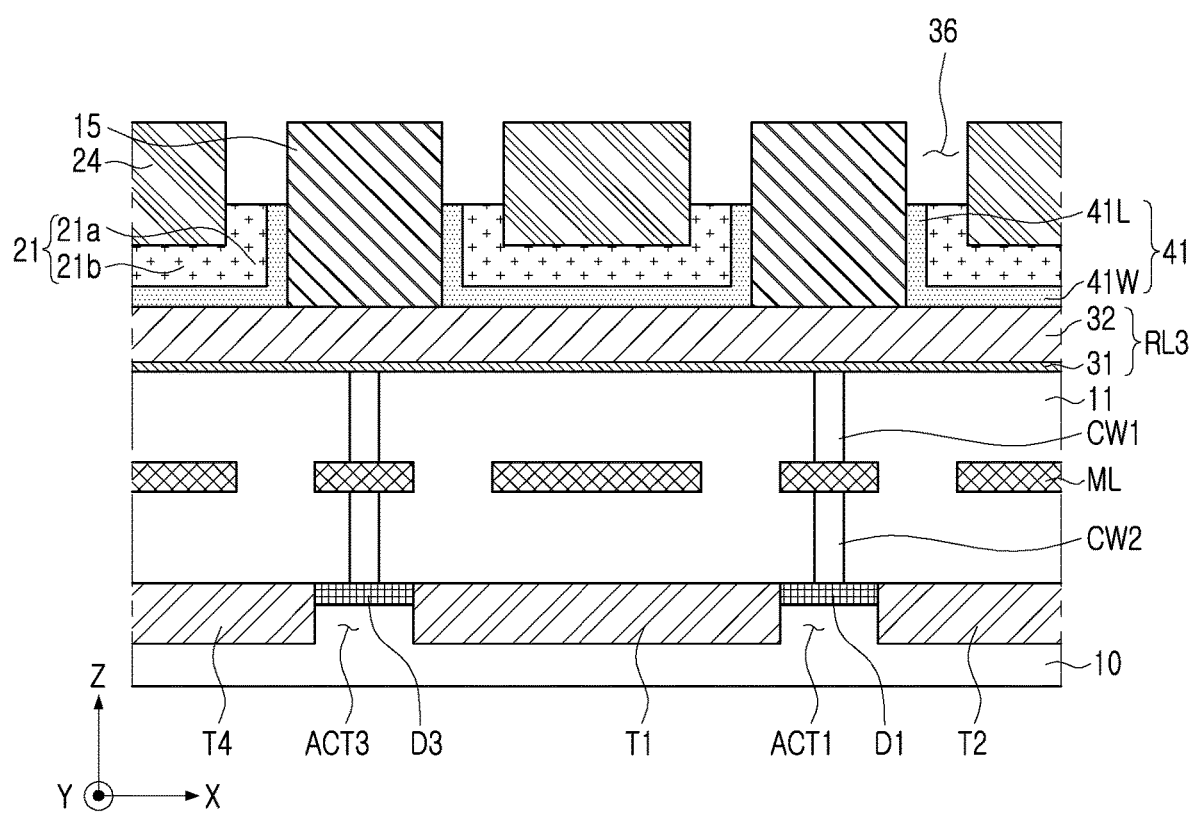

Referring to FIG. 18, second gap fill patterns 24 filling a plurality of openings of the first insulating patterns 15 may be formed.

The lower electrode layer 41, the spacer layer 21, and the second gap fill patterns 24 may be formed by forming a second gap fill material layer filling the opening 15a and performing a planarization process until the upper surface of the first insulating patterns 15 is exposed. The heights of the first insulating patterns 15, the spacer layer 21, and the lower electrode layer 41 may be lowered by the planarization process.

Mask patterns may be formed on the first insulating patterns 15, the lower electrode layer 41, the spacer layer 21, and the second gap fill patterns 24. The mask patterns may be in the form of a line extending in the first direction (e.g., the X-axis direction).

The first insulating patterns 15, the lower electrode layer 41, the spacer layer 21, and the second gap fill patterns 24 may be etched using the mask patterns as an etch mask to form linear shaped trenches.

After forming the insulating material layer filling the trenches, the second insulating patterns may be formed by performing a planarization process. The heights of the second insulating patterns, the first insulating patterns 15, and the second gap fill patterns 24 may be lowered by the planarization process.

The lower electrode layer 41, the spacer layer 21 and the second gap fill patterns 24 and the first insulating patterns 1.5 may remain on the third row line RL3.

The lower electrode layer 41 and the spacer layer 21 may be partially etched to form holes 36. The partially etched lower electrode layer 41 may include a lower electrode 41L and a lower electrode connection portion 41W extending from the lower electrode 41L in the first direction. The partially etched spacer layer 21 may include spacers 21a and a spacer connection portion 21b extending from the bottom of the spacers 21a in the first direction.

Figure 19:
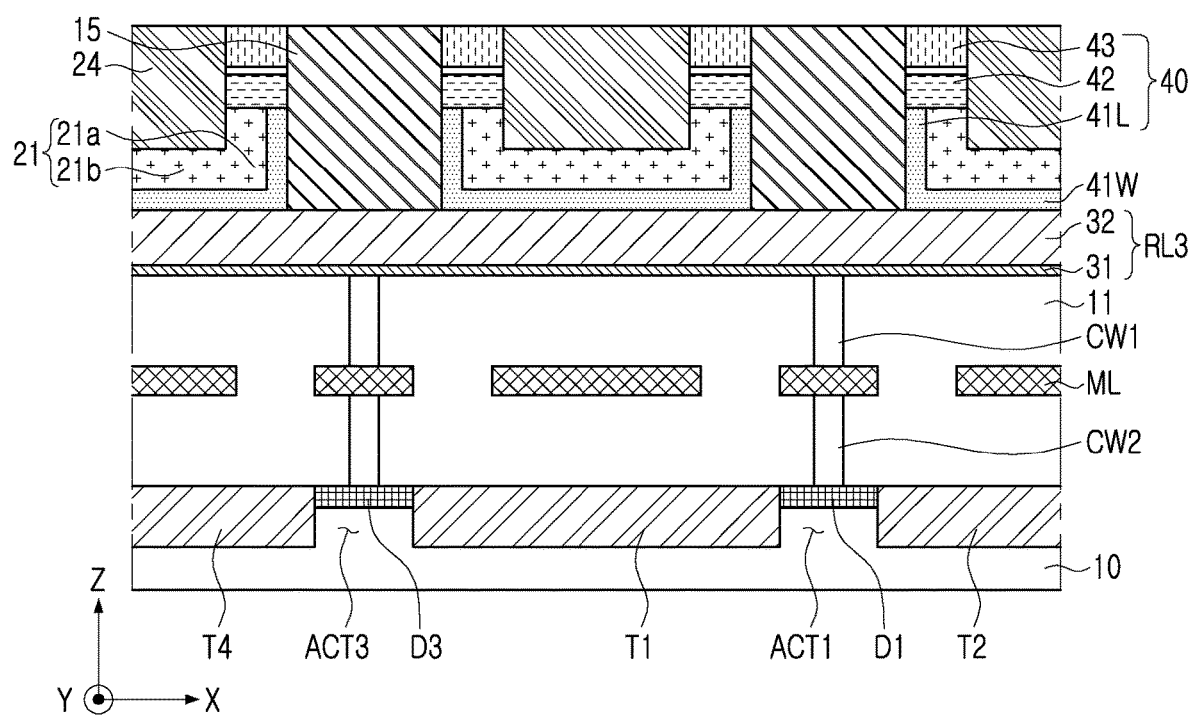

Referring to FIG. 19, data storage patterns 42 that partially fill the holes 36 may be formed. The upper electrodes 43 may be formed on the data storage patterns 42. The upper electrodes 43 may be thrilled in the holes 36.

The upper electrodes 43 may be formed by forming an electrode material layer covering the holes 36 and the data storage patterns 42 and performing a planarization process to form the second insulating patterns, the first insulating patterns 15 and the second gap fill patterns 24. The heights of the second insulating patterns, the first insulating patterns 15, and the second gap fill patterns 24 may be lowered by the planarization process.

Figure 20:
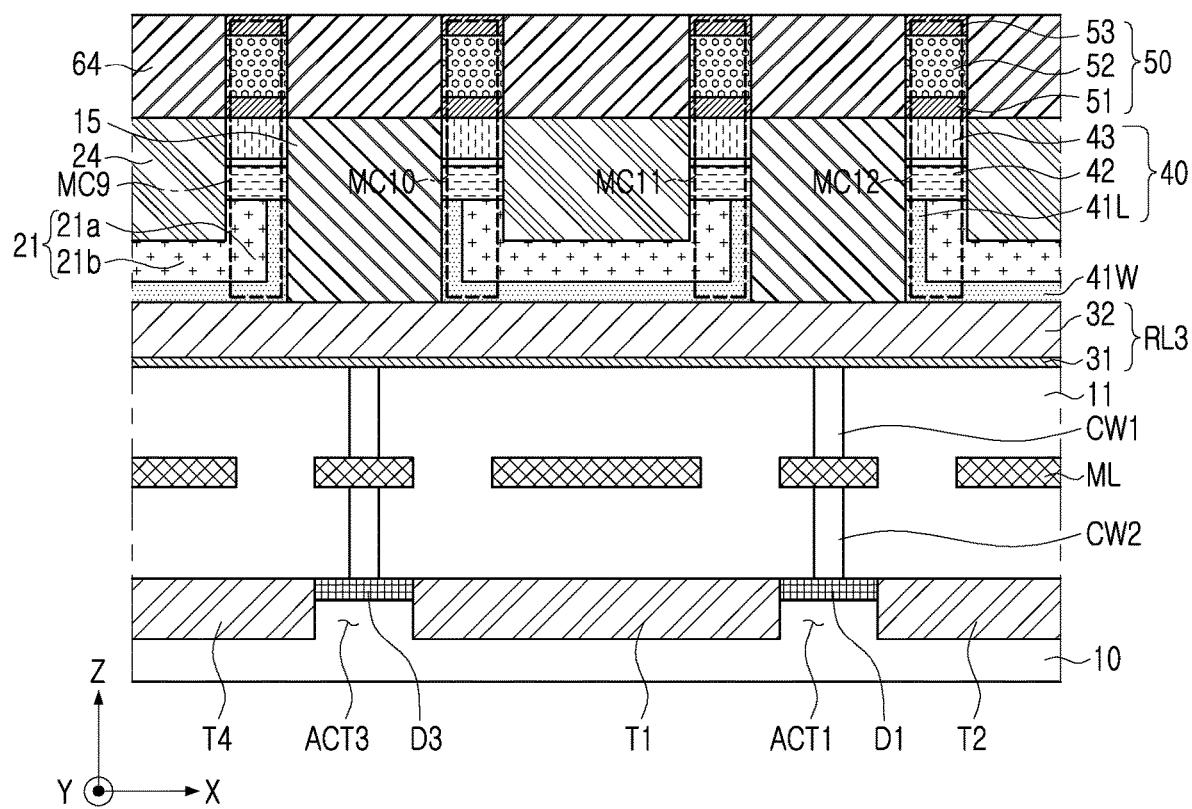

Referring to FIG. 20, a lower switching electrode 51, a switch 52, and an upper switching electrode 53 may be sequentially stacked on the data storage structure 40, using the patterning process.

A patterning process may be performed to form the switching structure 50 including the lower switching electrode 51, the switch 52, and the upper switching electrode 53, sequentially stacked on the data storage structure 40. The patterning process may include a double patterning process (DPT) that uses a spacer twice. The patterning process may be performed by performing a first double patterning process using first spacer masks extending in the first direction and then performing a second double patterning process using second spacer masks extending in the second direction, perpendicular to the first direction. A plurality of material layers may be deposited or removed for the patterning process. Moreover, a gap fill insulating layer 64 may be formed to fill a gap between the switching structures 50.

Figure 21:
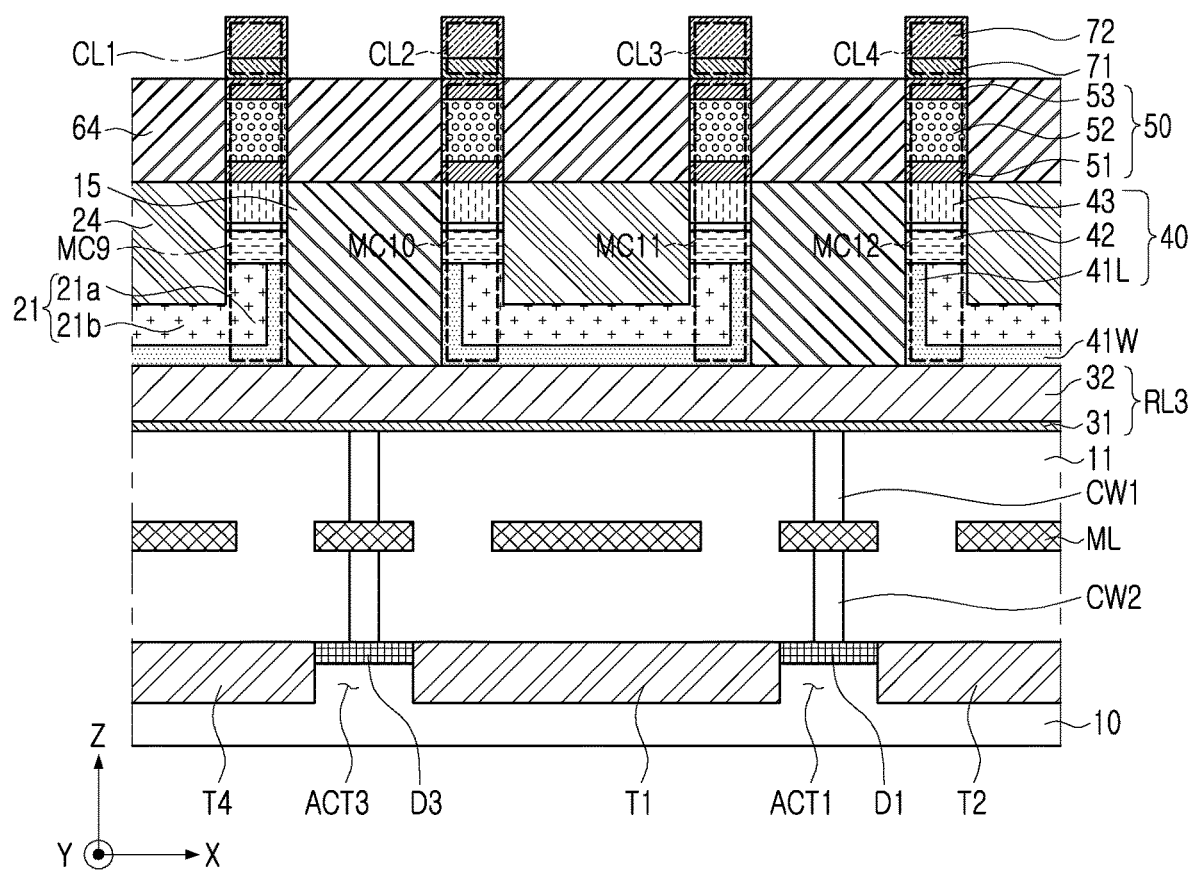

Referring to FIG. 21, a portion of the gap fill insulating layer 64 may be removed using a planarization process or the like, in such a manner that the upper switching electrode 53 is exposed. The planarization process may include a chemical mechanical polishing (CMP) process, an etch-back process, or a combination thereof. Further, a patterning process may be performed to form column lines CL1 to CL4 including first and second upper conductive layers 71 and 72 sequentially stacked. Each side of the first and second upper conductive layers 71 and 72 may be vertically aligned.

Figure 22:
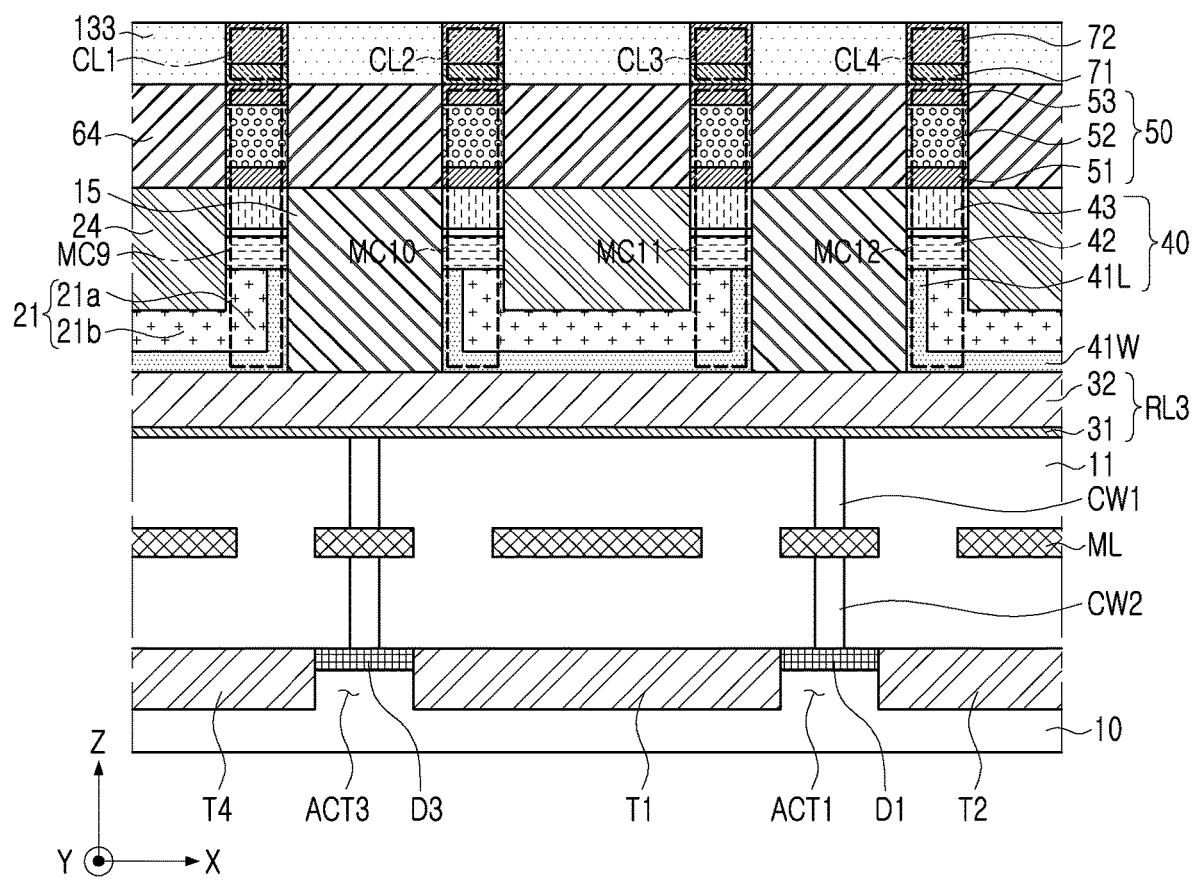

Referring to FIG. 22, third gap fill patterns 133 may be formed on the switching structures 50. The column lines CL1 to CL4 may extend in the second direction and may be separated from each other in the first direction by the third gap fill patterns 133.

As previously described, dummy word lines may have the same lower structure as main word lines, and may also have a structure floated from both p-type and n-type active regions. Therefore, recesses of main memory cells on the main word lines, which may occur when the data storage pattern is formed using the chemical mechanical polishing (CMP) process, may be prevented.

Figure 23:
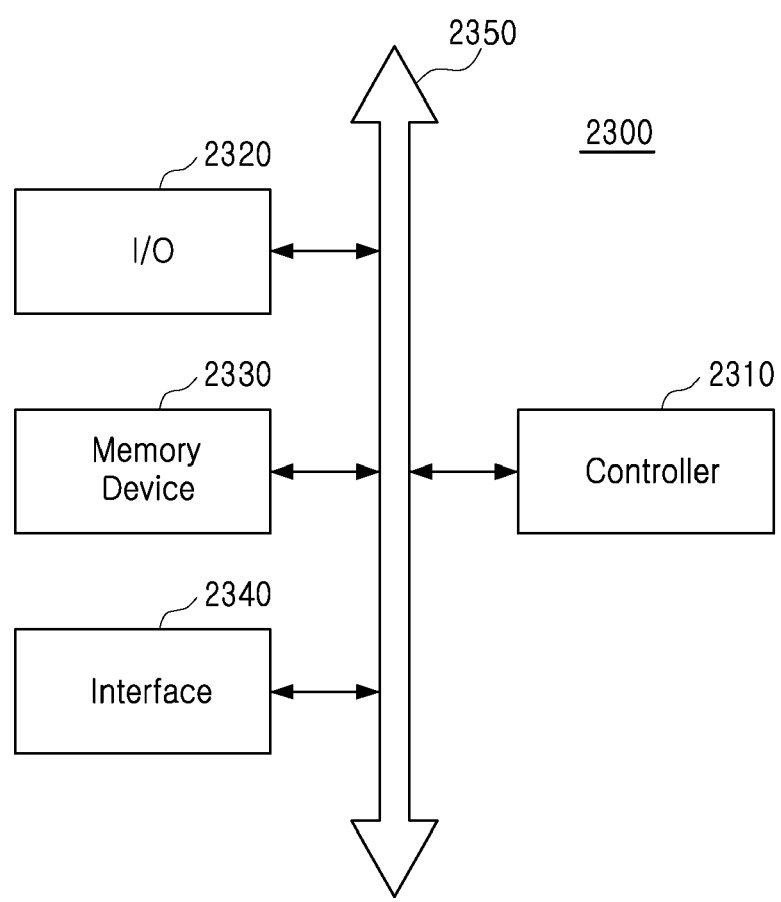
FIG. 23 is a block diagram of an electronic system including a semiconductor device according to exemplary embodiments of the present inventive concepts.

FIG. 23 is a block diagram illustrating an exemplary embodiment of an electronic system including a semiconductor device according to exemplary embodiments.

Referring to FIG. 23, the electronic system 2300 may include a controller 2310, an input/output device 2320, a memory device 2330, an interface 2340, and a bus 2350. The controller 2310, the input/output device 2320, the memory device 2330 and/or the interface 2340 may be connected to each other via a bus 2350. The bus 2350 may provide a path on which data is moved.

The controller 2310 may include at least one of a microprocessor, a digital signal process, a microcontroller, and logic elements capable of performing similar functions. The input/output device 2320 may include a keypad, a keyboard, a display device, and the like. The memory device 2330 may store data and/or instructions and the like. The memory device 2330 may include at least one of the semiconductor devices according to exemplary embodiments. The interface 2340 may be connected to a communications network and may perform data transmission/reception. The interface 2340 may include an antenna or a wired or wireless transceiver.

The electronic system 2300 may be applied to a personal digital assistant (PDA), tablet PC, a mobile phone, a memory card, or electronic devices capable of transmitting and receiving data in wireless environments.

Figure 24:
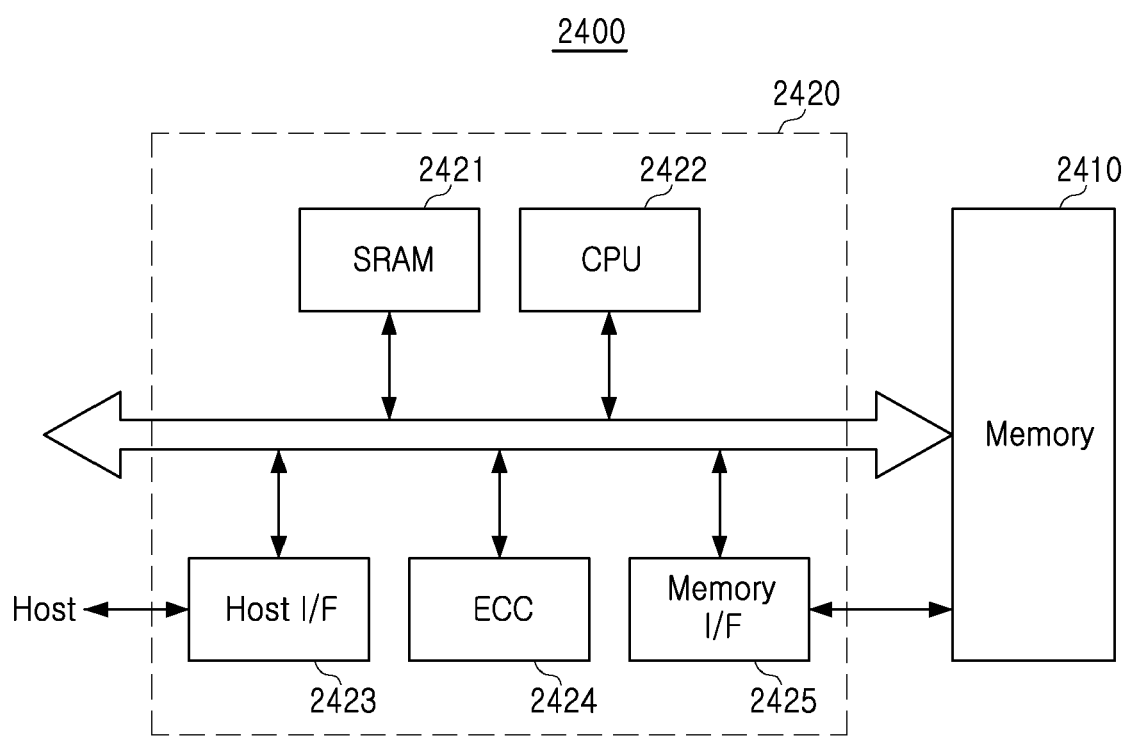
FIG. 24 is a block diagram illustrating a memory card including a semiconductor device according to exemplary embodiments of the present inventive concepts.

FIG. 24 is a block diagram illustrating a memory card including semiconductor devices according to exemplary embodiments.

Referring to FIG. 24, the memory card 2400 may include a memory device 2410. The memory device 2410 may include at least one of the semiconductor devices according to example embodiments.

The memory card 2400 may include a memory controller 2420 controlling the exchange of data between the host and the memory device 2410.

The memory controller 2420 may include a processing unit 2422 that controls the overall operation of the memory card 2400. The memory controller 2420 may include an SRAM 2421 used as an operating memory of the processing unit 2422. In addition, the memory controller 2420 may further include a host interface 2423, a memory interface 2425, and the like. The host interface 2423 may have a data exchange protocol between the memory card 2400 and the host. The memory interface 2425 may connect the memory controller 2420 and the memory device 2410. In addition, the memory controller 2420 may further include an ECC block 2424. The ECC block 2424 may detect and correct errors in the read data obtained from memory device 2410.

The memory card 2400 may be used as a solid state disk (SSD) or a portable storage medium.

As set forth above, in a semiconductor device according to exemplary embodiments, a recess defect occurring in a process of forming a data storage pattern may be significantly reduced.

In addition, in a semiconductor device according to exemplary embodiments, the integration of cells and a product yield may be improved by significantly reducing a recess defect in a data storage pattern.

While exemplary embodiments have been shown and described above, it will be apparent to those skilled in the art that modifications and variations could be made without departing from the scope of the present inventive concept as defined by the appended claims.

What is claimed is:

1. A semiconductor device comprising:
a plurality of word lines disposed on a substrate in which active regions are defined, and extends in a first direction;
a plurality of bit lines disposed on the plurality of word lines and extending in a second direction, perpendicular to the first direction; and
a plurality of memory cells disposed between the plurality of word lines and the plurality of bit lines and each including a data storage pattern, the plurality of memory cells including a plurality of dummy memory cells and a plurality of main memory cells,
wherein an upper surface of the data storage pattern of the main memory cells is higher than an upper surface of the data storage pattern of the dummy memory cells.

2. The semiconductor device of claim 1, wherein:
the plurality of dummy memory cells are connected to a plurality of the word lines; and
a contact plug is configured to connect at least one of the plurality of word lines that the plurality of dummy memory cells are connected thereto to at least one of the active regions.

3. The semiconductor device of claim 1, wherein:
the plurality of dummy memory cells and the plurality of main memory cells are connected to a plurality of the word lines;
the plurality of word lines that the plurality of dummy memory cells are connected thereto are not connected to the active regions; and
the plurality of word lines that the plurality of main memory cells are connected thereto are connected to at least one of the active regions.

4. The semiconductor device of claim 1, further comprising:
a first contact plug configured to connect at least one of the plurality of word lines to a portion of circuit wirings; and
a second contact plug configured to connect the portion of circuit wirings to at least one of the active regions.

5. The semiconductor device of claim 4, further comprising a base insulating layer disposed on the substrate and in contact with the plurality of word lines,
wherein the first and second contact plugs are disposed in the base insulating layer.

6. The semiconductor device of claim 1, further comprising:
a base insulating layer disposed between the substrate and the plurality of bit lines; and
a plurality of circuit wirings disposed in the base insulating layer.

7. The semiconductor device of claim 1, wherein the plurality of word lines are spaced apart from each other by a plurality of gap fill patterns comprising an insulating material.

8. The semiconductor device of claim 1, wherein each of the plurality of memory cells comprises:
a data storage structure and a switching structure disposed on the plurality of word lines,
wherein the data storage structure and the switching structure are electrically connected to each other by an intermediate electrode.

9. The semiconductor device of claim 8, wherein the switching structure comprises a threshold switching material.

10. The semiconductor device of claim 8, wherein the data storage structure comprises a lower electrode, the data storage pattern, and an upper electrode,
wherein the data storage pattern comprises a phase change material.

11. A semiconductor device comprising:
a plurality of row lines disposed on a substrate and extending in a first direction, the row lines spaced apart from each other in a second direction, perpendicular to the first direction;
a plurality of column lines disposed on the plurality of row lines, the column lines are spaced apart from each other in the first direction while extending in the second direction; and
a plurality of memory cells disposed between the plurality of row lines and the plurality of column lines and extending in a third direction, perpendicular to the first and second directions, the plurality of memory cells including a plurality of main memory cells and a plurality of dummy memory cells,
wherein at least one of the plurality of dummy memory cells is connected to one of a plurality of active regions defined in the substrate or floats from the plurality of active regions.

12. The semiconductor device of claim 11, further comprising:
a first contact plug that is configured to connect at least one of the plurality of row lines to a portion of circuit wirings; and a second contact plug that is configured to connect the portion of circuit wirings to the plurality of active regions.

13. The semiconductor device of claim 11, wherein:
the plurality of active regions includes p-type and n-type active regions; and
at least one of the plurality of dummy memory cells is connected to the p-type and n-type regions.

14. The semiconductor device of claim 11, wherein each of the memory cells comprises a lower electrode, a data storage pattern, an intermediate electrode, a switch and an upper electrode, that are disposed on the plurality of row lines,
wherein the data storage pattern comprises a phase change material, and the switch comprises a threshold switching material.

15. The semiconductor device of claim 14, wherein the lower electrode is electrically connected to one of the plurality of row lines, and the upper electrode is electrically connected to one of the plurality of column lines.

16. A semiconductor device comprising:
a first row line disposed on a substrate and extending in a first direction;
a second row line extending in the first direction and spaced apart from the first row line in a second direction, perpendicular to the first row line;
a column line disposed on the first and second row lines and extending in the second direction;
a first memory cell disposed between the first row line and the column line; and
a second memory cell disposed between the second row line and the column line,
wherein each of the first and second memory cells includes a data storage pattern, wherein a thickness of the data storage pattern of the first memory cell is less than a thickness of the data storage pattern of the second memory cell.

17. The semiconductor device of claim 16, further comprising:
a third row line disposed on the column line and overlapping the first row line in the first direction; and
a fourth row line disposed on the column line and overlapping the second row line in the second direction.

18. The semiconductor device of claim 16, wherein the first and second memory cells are connected to one or more active regions defined in the substrate, by a contact structure.

19. The semiconductor device of claim 18, wherein the contact structure comprises a plurality of contact plugs and circuit wirings disposed in a third direction perpendicular to the first direction and the second direction.

20. The semiconductor device of claim 16, wherein the first memory cell floats from one or more active regions defined in the substrate, and the second memory cell is connected to the active regions using a contact structure.

* * * * *